United States Patent
Yamashita et al.

(10) Patent No.: US 9,615,493 B2
(45) Date of Patent: Apr. 4, 2017

(54) LIGHT EMITTING DEVICE, AND METHOD FOR MANUFACTURING CIRCUIT BOARD

(71) Applicant: NICHIA CORPORATION, Anan-shi, Tokushima (JP)

(72) Inventors: Ryohei Yamashita, Tokushima (JP); Tomohide Miki, Tokushima (JP); Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 245 days.

(21) Appl. No.: 14/478,086

(22) Filed: Sep. 5, 2014

(65) Prior Publication Data

US 2014/0366369 A1    Dec. 18, 2014

Related U.S. Application Data

(63) Continuation of application No. 13/291,841, filed on Nov. 8, 2011, now Pat. No. 8,853,933.

(30) Foreign Application Priority Data

Nov. 11, 2010  (JP) ................................. 2010-253321

(51) Int. Cl.
  *H01L 33/62*   (2010.01)
  *H01L 33/48*   (2010.01)
  *H05K 13/00*   (2006.01)
  *H01L 23/00*   (2006.01)

(52) U.S. Cl.
  CPC ......... *H05K 13/0023* (2013.01); *H01L 24/97* (2013.01); *H01L 33/486* (2013.01); *H01L 33/62* (2013.01); *H01L 2224/48247* (2013.01); *H01L 2224/48257* (2013.01); *H01L 2224/49113* (2013.01); *H01L 2924/181* (2013.01); *Y10T 29/49124* (2015.01); *Y10T 29/49126* (2015.01)

(58) Field of Classification Search
  CPC ..... H01L 21/68–21/6838; H01L 51/56; H05B 33/10
  See application file for complete search history.

(56) References Cited

U.S. PATENT DOCUMENTS

| | | | |
|---|---|---|---|
| 2005/0110161 A1* | 5/2005 | Naito | ...................... H01L 24/81 257/778 |
| 2006/0023451 A1 | 2/2006 | Han et al. | |
| 2007/0187709 A1 | 8/2007 | Yamamoto | |

(Continued)

FOREIGN PATENT DOCUMENTS

| | | |
|---|---|---|
| JP | 2007-207986 A | 8/2007 |
| JP | 2008-172187 A | 7/2008 |

(Continued)

*Primary Examiner* — Mariceli Santiago
(74) *Attorney, Agent, or Firm* — Global IP Counselors, LLP

(57) ABSTRACT

A method for manufacturing a circuit board constituted by a light emitting device and a mounting board includes the steps of: conveying the light emitting device onto the mounting board in a state in which a top face is chucked by a nozzle so that the nozzle and an exposed part of a first terminal part of the light emitting device are in contact; and placing the light emitting device onto the mounting board so that the first terminal part and a wiring component are in contact in a state in which the top face is chucked by the nozzle.

18 Claims, 19 Drawing Sheets

(56) References Cited

U.S. PATENT DOCUMENTS

| | | |
|---|---|---|
| 2008/0165543 A1 | 7/2008 | Lin et al. |
| 2008/0258162 A1 | 10/2008 | Koung et al. |
| 2009/0194782 A1 | 8/2009 | Hata et al. |
| 2009/0242927 A1 | 10/2009 | Kobayakawa et al. |
| 2010/0001308 A1 | 1/2010 | Park et al. |
| 2010/0163920 A1 | 7/2010 | Itai |
| 2011/0070673 A1 | 3/2011 | Yamamoto |
| 2011/0186902 A1 | 8/2011 | Egoshi et al. |
| 2011/0210354 A1 | 9/2011 | Ichikawa et al. |
| 2013/0153942 A1 | 6/2013 | Yamashita |

FOREIGN PATENT DOCUMENTS

| | | |
|---|---|---|
| JP | 2009-260222 A | 11/2009 |
| JP | 2010-016358 A | 1/2010 |
| JP | 2010-062272 A | 3/2010 |
| TW | 2008-30581 A1 | 7/2008 |

\* cited by examiner

LIGHT EMITTING DEVICE, AND METHOD FOR MANUFACTURING CIRCUIT BOARD

CROSS-REFERENCE TO RELATED APPLICATIONS

This is a continuation application of U.S. patent application Ser. No. 13/291,841 filed on Nov. 8, 2011. This application claims priority under 35 U.S.C. §119 to Japanese Patent Application No. 2010-253321, filed on Nov. 11, 2011. The entire disclosures of U.S. patent application Ser. No. 13/291,841 and Japanese Patent Applications No. 2010-253321 are hereby incorporated herein by reference.

BACKGROUND

Technical Field

The present invention relates to a light emitting device comprising a light emitting element, and to a circuit board comprising this light emitting device and a mounting board.

Background Information

Light emitting devices comprising a light emitting element (such as a light emitting diode or a laser diode) have been widely used in the past as the light source for LCD television backlights, lighting fixtures, optical communications devices, and so forth.

Light emitting devices are generally classified as either a top-view type or a side-view type, according to the direction in which the light emitted by the light emitting element is taken off. With a top-view type of light emitting device, the emitted light from a light emitting element 10 is taken off in a direction perpendicular to the mounting face. With a side-view type of light emitting device, the emitted light from the light emitting element is taken off in a direction that is parallel to the mounting face.

With a light emitting device such as this, the top face of the light emitting device is chucked and conveyed onto the mounting board by a nozzle of the device that mounts the light emitting device, and is then mounted on the mounting face of the mounting board.

In Japanese Laid-Open Patent Application 2010-62272 (hereinafter referred to as the "Patent Literature 1"), there is also a known light emitting device manufactured by cutting a lead frame and a molded article that is integrally molded with the lead frame, in order to manufacture many light emitting devices in a short time and increase production efficiency. The light emitting device in Patent Literature 1 has a substantially cuboid shape, and has a bottom face that abuts the mounting face, a top face that is the light emission face opposite the bottom face, and four side faces that are contiguous with the bottom face and the top face. The light emitting device in Patent Literature 1 has a pair of flat leads embedded in the molded article. One of the flat leads has a face on which a light emitting element is placed on the top face side, and the other flat lead has a face that is electrically connected to the light emitting element on the top face side. The bottom face side of the pair of flat leads had by the light emitting device in Patent Literature 1 is exposed from the bottom face of the light emitting device over a large enough area to allow a good solder bond. Therefore, the light emitting device in Patent Literature 1 is a top-view type of light emitting device that has a terminal on the bottom face and has a light emission face on the top face.

SUMMARY

For example, when a substantially cuboid light emitting device having a bottom face, a top face that is opposite the bottom face, and four side faces that are contiguous with the bottom face and the top face is used as a side-view type of light emitting device, it is necessary for the bottom face where the terminal is provided to abut the mounting face, and to provide the light emission face on a side face. The flat leads having a face on which a light emitting element is placed and a face that is electrically connected to the light emitting element are disposed substantially parallel to the light emission face, that is, substantially parallel to a side face, and are embedded in the molded article. That is, the thickness portion of the lead with a smaller surface area (that is, the side face of the flat lead) faces the top face of the light emitting device. In mounting the light emitting device to a mounting board with a nozzle, the top face of the light emitting device is chucked by the nozzle, and pressure is applied from the top face toward the interior of the package.

With a top-view type of light emitting device, the molded article of the top face is sandwiched between the flat lead disposed parallel to the top face and the nozzle, whereas with a side-view type of light emitting device, the molded article of the top face is sandwiched between the thickness portion of the flat lead disposed parallel to the side face and the nozzle. Since the surface area of the top face of a side-view type of light emitting device is larger than the surface area of the lead touching the molded article of the top face, the surface area of the molded article not sandwiched between the lead and the nozzle is large. Therefore, the molded article of the top face readily bends under pressing force from the nozzle, making the molded article of the top face susceptible to cracking. This ends up lowering the yield.

The technology disclosed herein was conceived in light of the above situation, and it is an object thereof to provide a side-view type of light emitting device with which the yield is increased by reducing cracking of the top face when pressure is applied from the top face side toward the interior of the package.

A method according to one aspect is a method for manufacturing a circuit board constituted by a light emitting device and a mounting board, the light emitting device comprising a light emitting element and a package, the package constituted by a molded article and at least a first lead and a second lead embedded in the molded article, the package having a bottom face, a top face disposed opposite to the bottom face and a light emission face connected to the bottom face and the top face, the first lead and the second lead electrically connected with the light emitting element, the first lead including a first terminal part exposed at the bottom face and an exposed part exposed at the top face, and the exposed part provided more toward the center of the package than the first terminal part, the mounting board comprising a wiring component connected to the first terminal part. The method includes the steps of: conveying the light emitting device onto the mounting board in a state in which the top face is chucked by the nozzle so that the nozzle and the exposed part are in contact; and placing the light emitting device onto the mounting board so that the first terminal part and the wiring component are in contact in a state in which the top face is chucked by the nozzle.

The technology disclosed herein provides a side-view type of light emitting device with which the top face is supported by a first exposed part when pressure is applied from the top face side toward the interior of the package, making bending less likely toward the interior of the package, so cracking can be reduced on the top face, and the yield can be increased.

DETAILED DESCRIPTION OF EMBODIMENTS

Embodiments of the present invention will now be described through reference to the drawings. In the discussion of the drawings below, portions that are the same or similar will be given the same or similar numbers. The drawings, however, are merely representations, and the proportions of the various dimensions may vary from those in actuality. Therefore, specific dimensions and so forth should be decided on by referring to the following description. Also, the dimensional relations and proportions of some portions may, of course, vary from one drawing to the next.

First Embodiment

Summary of First Embodiment

In the first embodiment, we will describe a side-view type of light emitting device in which the top face is supported by a first exposed part when pressure is applied from the top face side toward the interior of the package, and bending toward the interior of the package is less apt to occur, so cracking is less likely to occur in the top face and the yield can be increased. More specifically, the light emitting device has a package constituted by a molded article and leads embedded in the molded article, and the each lead has a terminal part exposed at the bottom face, and an exposed part that is exposed at the top face.

The configuration of the light emitting device, mounting board, and circuit board, and the method for manufacturing the light emitting device, will now be described in order.

Configuration of Light Emitting Device

Figure 1:
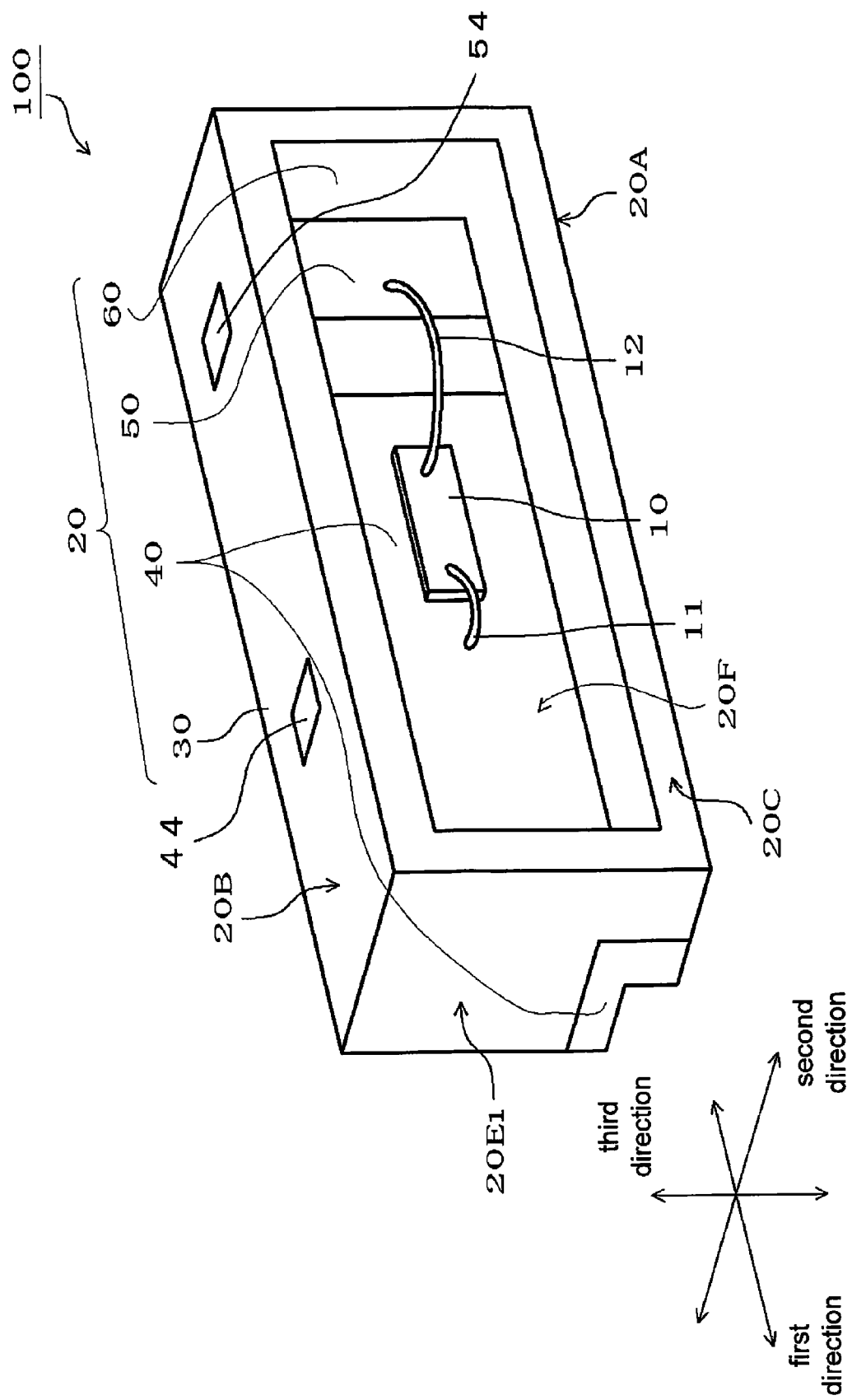
FIG. 1 is an oblique view of a light emitting device 100 pertaining to a first embodiment, as seen from the front.
Figure 2:
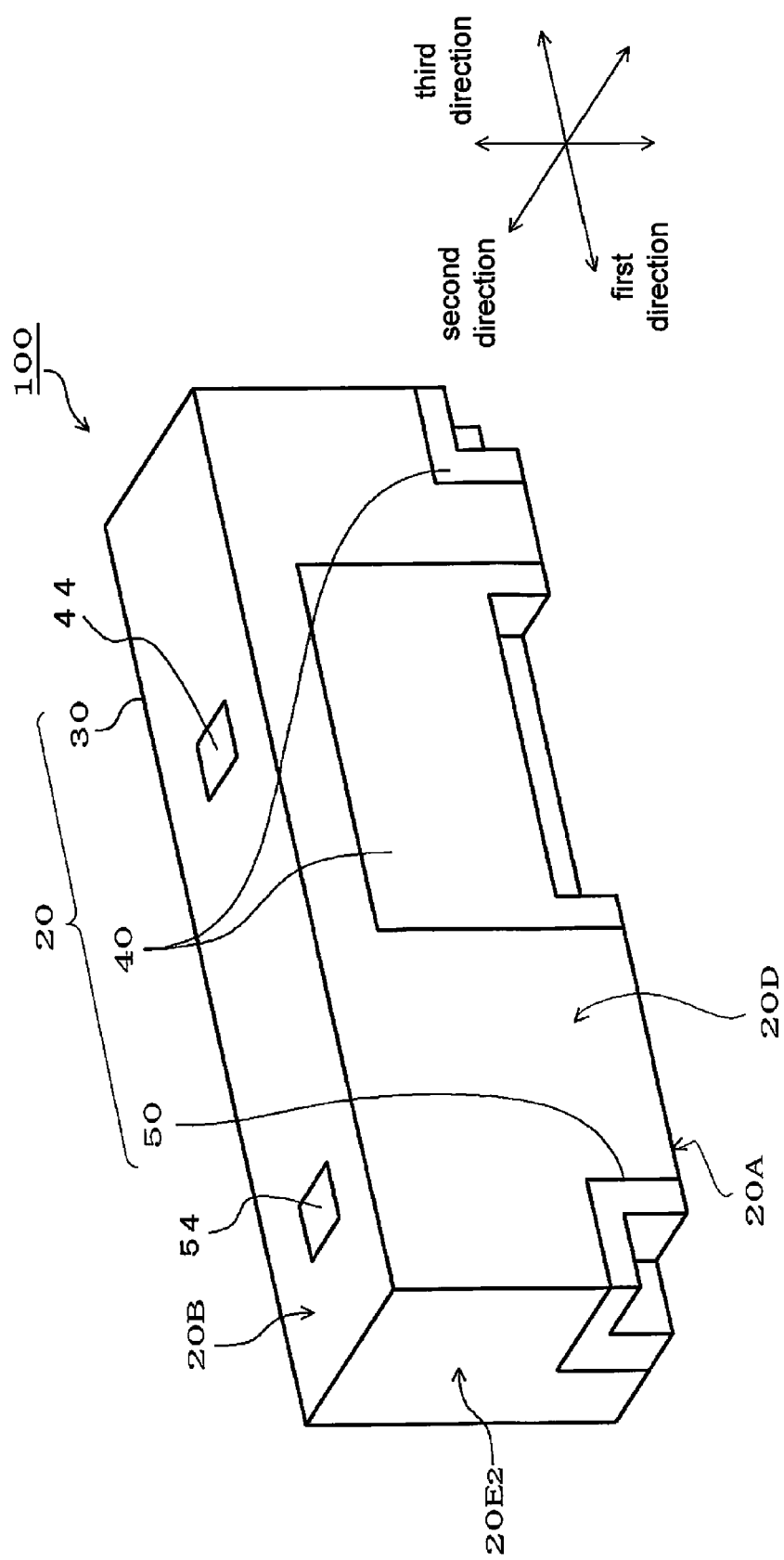
FIG. 2 is an oblique view of the light emitting device 100 pertaining to the first embodiment, as seen from the rear.

The configuration of the light emitting device pertaining to the first embodiment will be described through reference to the drawings. FIG. 1 is an oblique view of a light emitting device 100 pertaining to the first embodiment, as seen from the front. FIG. 2 is an oblique view of a light emitting device 100 pertaining to the first embodiment, as seen from the rear.

The light emitting device 100 comprises a light emitting element 10 and a package 20. The light emitting device 100 pertaining to this embodiment is what is known as a side-view type of light emitting device, and light emitted from the light emitting element 10 is taken off in a direction parallel to a mounting face 200A (see FIG. 6) of a mounting board 200 (discussed below).

In this embodiment, the light emitting device 100 has a substantially cuboid shape that extends along a first direction parallel to the mounting face 200A. In this embodiment, the size of the light emitting device 100 is approximately 3 mm in the first direction, about 1 mm in a direction parallel to the mounting face 200A and perpendicular to the first direction (hereinafter referred to as the "second direction"), and about 1 mm in a direction perpendicular to the first direction and the second direction (that is, a direction perpendicular to the mounting face 200A; hereinafter referred to as the "third direction"). The size of the light emitting device 100 is not limited to this, however.

The light emitting device 100 pertaining to this embodiment is a side-view type, and the ratio of the height in the third direction to the depth in the second direction is greater than that of a top-view type. Specifically, a side-view type is taller than a top-view type. Accordingly, the light emitting device 100 pertaining to this embodiment is characterized by a tendency to topple.

Light Emitting Element 10

The light emitting element 10 is placed in the package 20. The light emitting element 10 is electrically connected to the package 20 via a first wire 11 and a second wire 12.

The light emitting element 10 is formed in a flat shape, and is disposed perpendicular to the second direction. The emitted light from the light emitting element 10 is taken off in a direction parallel to the second direction, from a front face opening 20F (discussed below).

The light emitting element 10 is a semiconductor light emitting element called a light emitting diode, for example. The light emitting element 10 preferably has as its light emitting layer a semiconductor such as GaAlN, ZnS, SnSe, SiC, GaP, GaAlAs, AlN, InN, AlInGaP, InGaN, GaN, or AlInGaN on a substrate, but is not limited to this.

A face-up structure or a face-down structure can be employed for the light emitting element 10. There are no particular restrictions on the size of the light emitting element 10, but examples include 350 μm square, 500 μm square, and 1 mm square.

Package 20

In this embodiment, the package 20 has a substantially cuboid shape that extends in the first direction. The package 20 has a bottom face 20A, a top face 20B, a front face 20C, a rear face 20D, a first side face $20E_1$, and a second side face $20E_2$.

The bottom face 20A hits the mounting face 200A (see FIG. 9) when the light emitting device 100 is mounted. The top face 20B is provided opposite the bottom face 20A. The front face 20C is a light emission face that is contiguous with the bottom face 20A and the top face 20B. The front face 20C has the front face opening 20F. The front face opening 20F guides the light emitted from the light emitting element 10 to outside the package 20. The light emitting element 10 is placed on a first connection face 41A (see FIG. 3) exposed in the interior of the front face opening 20F. The rear face 20D is contiguous with the bottom face 20A and the top face 20B, and is provided opposite the front face 20C. The rear face 20D is perpendicular to the second direction. The boundary between the rear face 20D and the bottom face 20A is parallel to the first direction. The first side face $20E_1$ is contiguous with the rear face 20D and the front face 20C. The second side face $20E_2$ is provided opposite the first side face $20E_1$. The first side face $20E_1$ and the second side face $20E_2$ are perpendicular to the first direction.

The package 20 is made up of a molded article 30, a first lead 40, a second lead 50, and a sealing resin 60.

(1) Molded Article 30

The molded article 30 forms the outer shape of the package 20. The molded article 30 is heat resistant and has the required strength, and is made of an electrically insulating material that does not readily transmit outside light, the light emitted from the light emitting element 10, or other such light. A favorable example of this material is a triazine derivative epoxy resin, which is a thermosetting resin. This thermosetting resin may contain an acid anhydride, an antioxidant, a parting agent, a light reflecting member, an inorganic filler, a curing catalyst, a light stabilizer, and a lubricant. Titanium dioxide, added in an amount of 0 to 90 wt %, and preferably 10 to 60 wt %, can be used as the light reflecting member. The material of the molded article 30 is not limited to this, however, and can be, for example, one or more types of thermosetting resin selected from among epoxy resins, modified epoxy resins, silicone resins, modified silicone resins, acrylate resins, and urethane resins. Epoxy resins, modified epoxy resins, silicone resins, and modified silicone resins are particularly favorable as the material for the molded article 30. A thermoplastic resin may also be used, such as a liquid crystal polymer, a polyphthalamide resin, or polybutylene terephthalate (PBT).

(2) First Lead 40 and Second Lead 50

The first lead 40 and the second lead 50 are preferably made of a material having a relatively high thermal conductivity (such as at least about 200 W/(m·K)). This allows any heat generated from the light emitting element 10 to be efficiently transmitted. Examples of such a material include one or more layers of nickel, gold, copper, silver, molybdenum, tungsten, aluminum, iron, or another such metal, or of an iron-nickel alloy, phosphor bronze, ferrous copper, or another such alloy. The surfaces of the first lead 40 and the second lead 50 may also be plated.

The majority of the first lead 40 and the second lead 50 is embedded in the molded article 30, and just parts of the first lead 40 and the second lead 50 are exposed from the molded article 30. Specifically, just parts of the first lead 40 and the second lead 50 can be seen from the outside of the package 20. In particular, the first lead 40 and the second lead 50 each have one external electrode that can be seen form the outside of the package 20 (a first terminal part 42 and a second terminal part 52 (see FIG. 4); discussed below). In this embodiment, no external electrodes other than these two can be seen from the outside of the package 20. The configuration of the first lead 40 and the second lead 50 will be discussed below.

(3) Sealing Resin 60

The sealing resin 60 is packed into the interior of the front face opening 20F, and seals the light emitting element 10. This sealing resin 60 can be a translucent resin, such as one or more types of resin selected from among polyolefin resins, polycarbonate resins, polystyrene resins, epoxy resins, acrylic resins, acrylate resins, methacrylic resins (PMMA, etc.), urethane resins, polyimide resins, polynorbornene resins, fluororesins, silicone resins, modified silicone resins, and modified epoxy resins. This material may also contain a diffusion agent, filler, pigment, fluorescent substance, etc., as discussed in Japanese Laid-Open Patent Application 2006-229055 and WO2006/038502.

Lead Configuration

Figure 3:
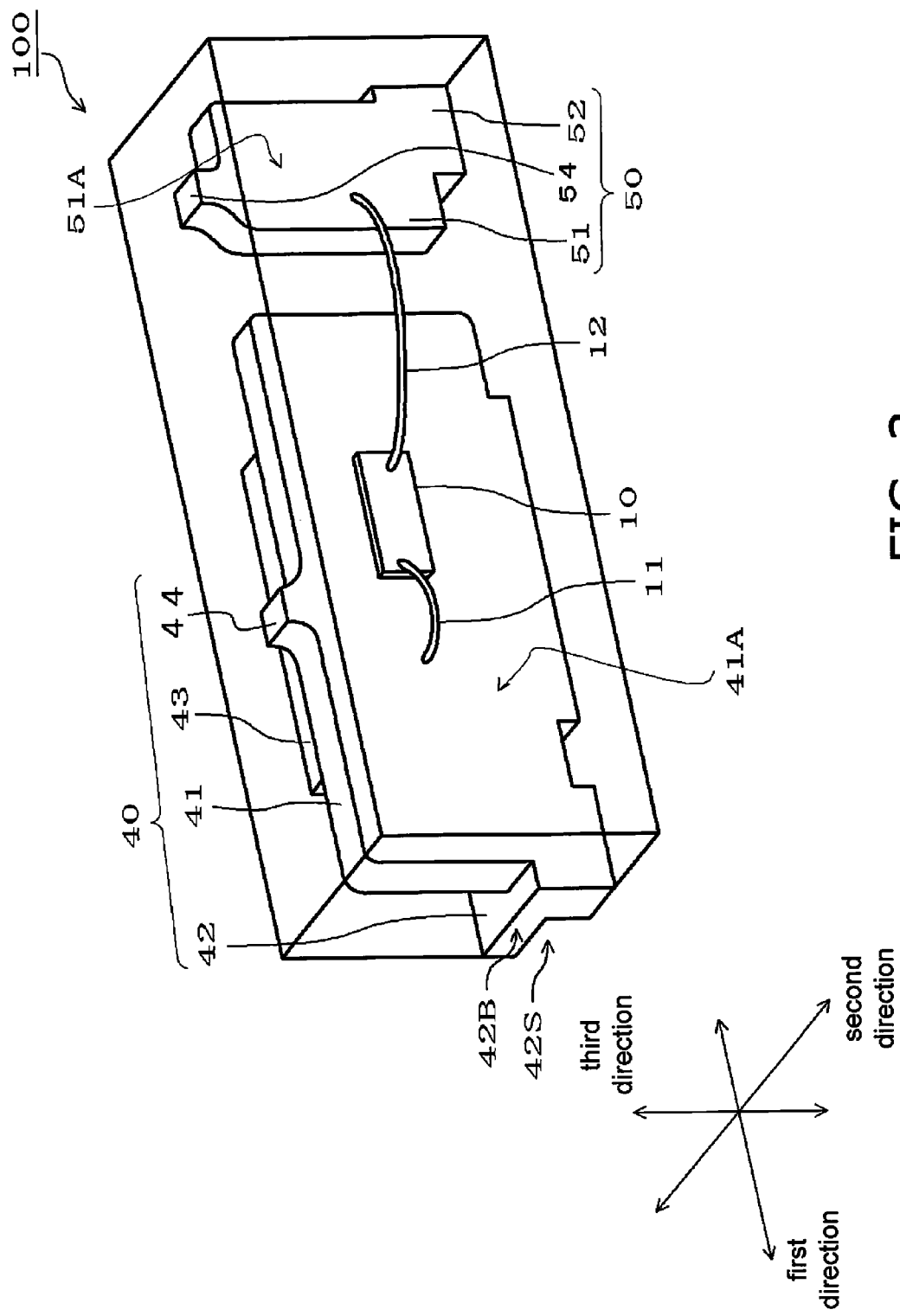
FIG. 3 is a see-through view of FIG. 1.
Figure 4:
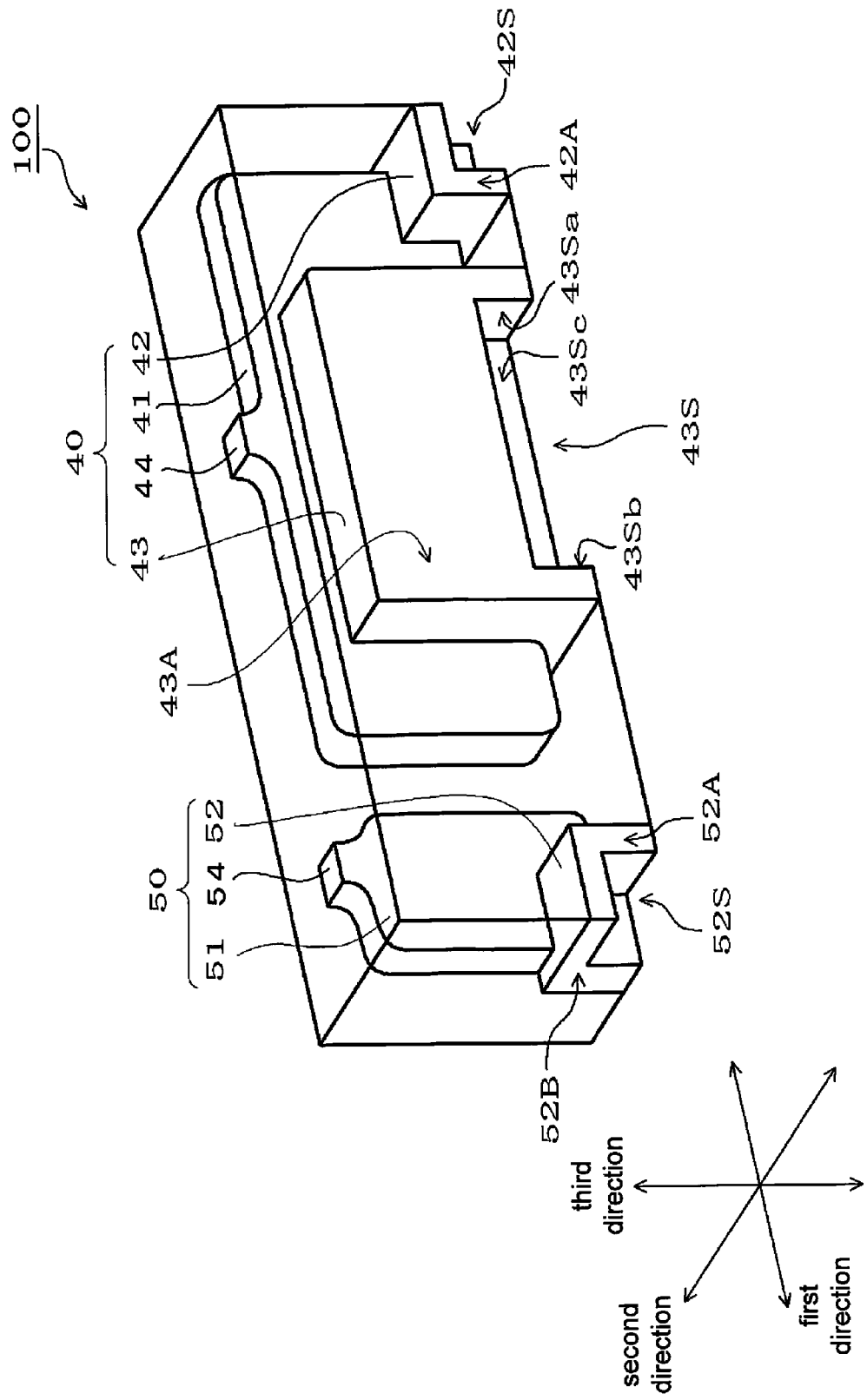
FIG. 4 is a see-through view of FIG. 2.
Figure 5:
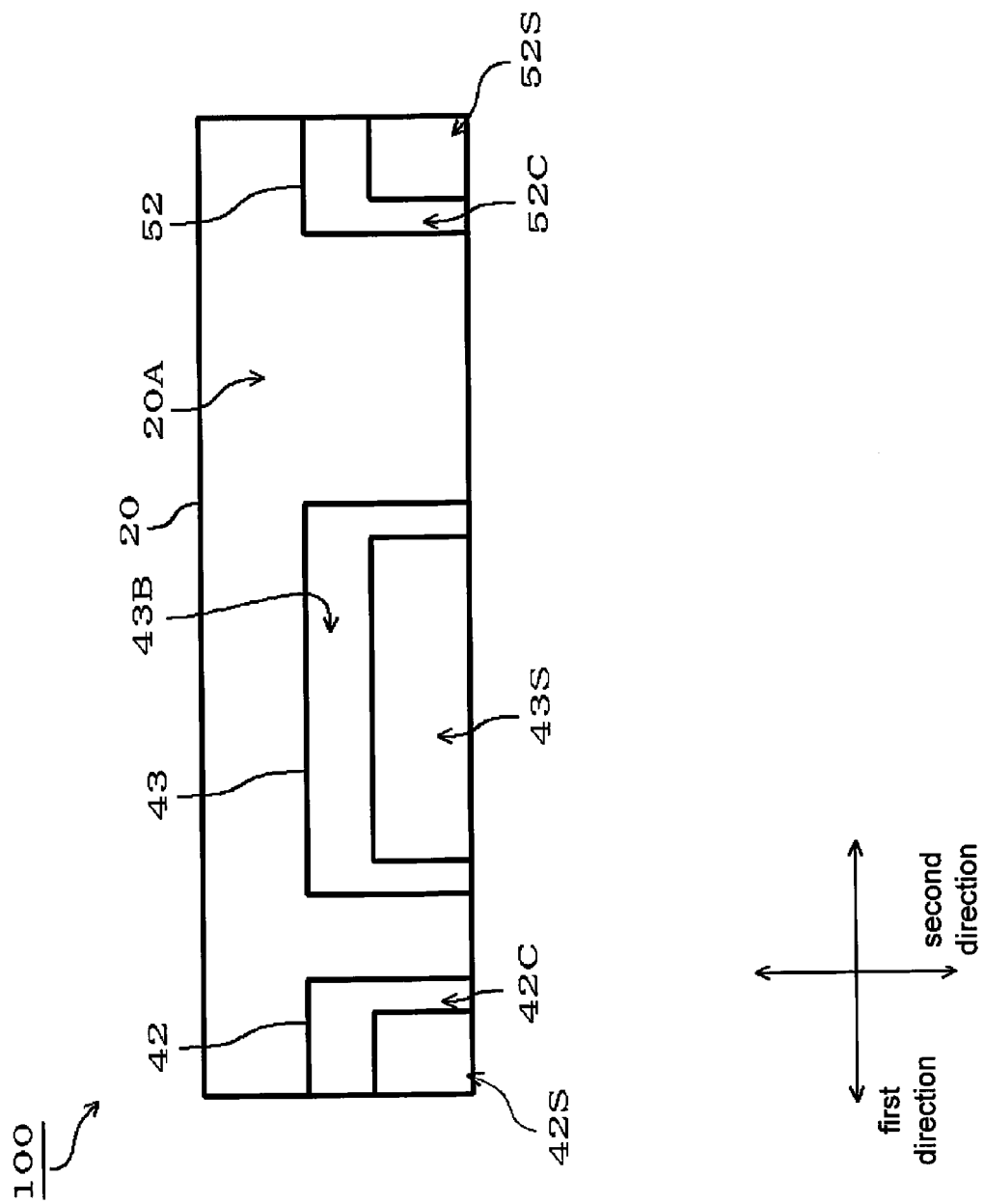
FIG. 5 is a plan view of a bottom face 20A of the light emitting device 100 pertaining to the first embodiment.

Next, the configuration of the leads pertaining to the first embodiment will be described through reference to the drawings. FIG. 3 is a see-through view of FIG. 1. FIG. 4 is a see-through view of FIG. 2. FIG. 5 is a plan view of a bottom face 20A of the light emitting device 100 pertaining to the first embodiment. In FIGS. 3 and 4, the molded article 30 is shown in outline.

Configuration of First Lead 40

The first lead 40 is made up of a first connector 41, the first terminal part 42, a base part 43, and a first exposed part 44. In this embodiment, the first terminal part 42, the base part 43, and the first exposed part 44 are integrally linked to the first connector 41.

(1) First Connector 41

The first connector 41 is formed in a flat shape, and is disposed along the rear face 20D. The first connector 41 has a first connection face 41A that is exposed from the molded article 30. The first connection face 41A is exposed from the molded article 30 in the interior of the front face opening 20F. The light emitting element 10 is placed in the first connection face 41A (that is, the first connection face 41A serves as the placement face where the light emitting element 10 is placed), and the first wire 11 is also connected to the first connection face 41A. This electrically connects the first connector 41 to the light emitting element 10 (that is, the first connector 41 serves as a placement face where the light emitting element 10 is placed). The first connection face 41A is sealed by the sealing resin 60 (see FIG. 1).

(2) First Terminal Part 42

The first terminal part 42 is formed in a three-dimensional shape, and is linked to the lower end of the first connector 41 on the first side face $20E_1$ side. The first terminal part 42 is exposed from the molded article 30 at the boundary between the bottom face 20A, the rear face 20D, and the first side face $20E_1$, and functions as an external electrode of the light emitting device 100. The first terminal part 42 has a first end face 42A, a second end face 42B, a third end face 42C, and a first terminal concavity 42S.

The first end face 42A is exposed from the molded article 30 at the rear face 20D of the package 20. The first end face 42A forms part of the rear face 20D. The second end face 42B is exposed from the molded article 30 at the first side face $20E_1$ of the package 20. The second end face 42B forms part of the first side face $20E_1$. The third end face 42C is exposed from the molded article 30 at the bottom face 20A of the package 20. The third end face 42C forms part of the bottom face 20A. The first terminal concavity 42S is a cut-out formed at the boundary between the bottom face 20A, the rear face 20D, and the first side face $20E_1$. The first terminal concavity 42S communicates with three faces: the bottom face 20A, the rear face 20D, and the first side face $20E_1$. When the light emitting device 100 is mounted, solder (part of a first solder fillet 301; see FIG. 7) is held in the first terminal concavity 42S.

(3) Base Part 43

The base part 43 is lined to the bottom face 20A side of the first connector 41, that is, to the lower end of the first connector 41. The base part 43 is exposed from the molded article 30 at the bottom face 20A. The base part 43 is the base of the light emitting device 100, and functions as an "overlap" that makes the light emitting device 100, which is tall and prone to tipping, less likely to tip over.

In this embodiment, the base part 43 also functions as a heat sink that releases heat generated from the light emitting element 10. More specifically, the base part 43 is exposed from the molded article 30 at the bottom face 20A and the rear face 20D of the package 20. As shown in FIGS. 4 and 5, the base part 43 has a first exposed face 43A that is exposed from the molded article 30 at the rear face 20D, and a second exposed face 43B that is exposed from the molded article 30 at the bottom face 20A. The first exposed face 43A forms part of the rear face 20D, and the second exposed face 43B forms part of the bottom face 20A. When the light emitting device 100 is mounted, the first exposed face 43A is exposed on the outside of the light emitting device 100, and the second exposed face 43B is in contact with the mounting face 200A (see FIG. 7).

Also, in this embodiment, the base part 43 has a concavity 43S that communicates with the bottom face 20A and the rear face 20D. The concavity 43S is a cut-out formed in part of the boundary between the bottom face 20A and the rear face 20D. As shown in FIG. 4, the concavity 43S has a first inner wall 43Sa, a second inner wall 43Sb, and a third inner wall 43Sc. The first inner wall 43Sa is perpendicular to the first direction. The second inner wall 43Sb is opposite the first inner wall 43Sa. The third inner wall 43Sc is perpendicular to the second direction and is contiguous with the first inner wall 43Sa and the second inner wall 43Sb. When the light emitting device 100 is mounted, a third solder fillet 303a is formed over the first inner wall 43Sa, and a third solder fillet 303b is formed over the second inner wall 43Sb (see FIG. 7). Meanwhile, when the light emitting device 100 is mounted, the third inner wall 43Sc is exposed on the outside of the light emitting device 100.

(4) First Exposed Part 44

The first exposed part 44 is linked to the top face 20B side of the first connector 41, that is, to the upper end of the first connector 41. The first exposed part 44 is exposed from the molded article 30 at the top face 20B and forms part of the top face 20B. The first exposed part 44 is surrounded by the molded article 30. The first exposed part 44 is located more toward the center of the package 20 than the first terminal part 42 in the first direction (that is, the width direction of the package 20).

In this embodiment, the first exposed part 44 is formed so as to be opposite the base part 43, with the first connector 41 in between.

Configuration of Second Lead 50

The second lead 50 is made up of a second connector 51, the second terminal part 52, and a second exposed part 54. In this embodiment, the second connector 51, the second terminal part 52, and the second exposed part 54 are formed integrally.

(1) Second Connector 51

The second connector 51 is formed in a flat shape, and is disposed along the rear face 20D. The first to third side faces $20D_1$ to $20D_3$ of the second connector 51 are covered by the molded article 30. Meanwhile, the second connector 51 has a second connection face 51A that is exposed from the molded article 30.

The second connection face 51A is exposed from the molded article 30 in the interior of the front face opening 20F. The second wire 12 is connected to the second connection face 51A. This electrically connects the second connector 51 and the light emitting element 10. The second connection face 51A is sealed by the sealing resin 60 (see FIG. 1).

(2) Second Terminal Part 52

The second terminal part 52 is formed in a three-dimensional shape, and is linked to the lower end of the second connector 51 on the second side face $20E_2$ side. Part of the second terminal part 52 is exposed from the molded article 30 at the boundary between the bottom face 20A, the rear face 20D, and the second side face $20E_2$, and functions as an external electrode of the light emitting device 100. The second terminal part 52 has a first end face 52A, a second end face 52B, a third end face 52C, and a second terminal concavity 52S.

The first end face 52A is exposed from the molded article 30 at the rear face 20D of the package 20. The first end face 52A forms part of the rear face 20D. The second end face 52B is exposed from the molded article 30 at the second side face $20E_2$ of the package 20. The second end face 52B forms part of the second side face $20E_2$. The third end face 52C is exposed from the molded article 30 at the bottom face 20A of the package 20. The third end face 52C forms part of the bottom face 20A. The second terminal concavity 52S is a cut-out formed at the boundary between the bottom face 20A, the rear face 20D, and the second side face $20E_2$. The second terminal concavity 52S communicates with three faces: the bottom face 20A, the rear face 20D, and the second side face $20E_2$. When the light emitting device 100 is mounted, solder (part of a second solder fillet; see FIG. 7) is held in the second terminal concavity 52S.

(3) Second Exposed Part 54

The second exposed part 54 is linked to the top face 20B side of the second connector 51, that is, to the upper end of the second connector 51. The second exposed part 54 is exposed from the molded article 30 at the top face 20B, and forms part of the top face 20B. The second exposed part 54 is surrounded by the molded article 30. The second exposed part 54 is located more toward the center of the package 20 than the second terminal part 52 in the first direction (that is, the width direction of the package 20). Therefore, the first exposed part 44 and the second exposed part 54 are disposed aligned between the first terminal part 42 and the second terminal part 52.

In this embodiment, the second exposed part 54 is formed so as to be opposite the second terminal part 52 with the first connector 41 in between.

Configuration of Mounting Board

Figure 6:
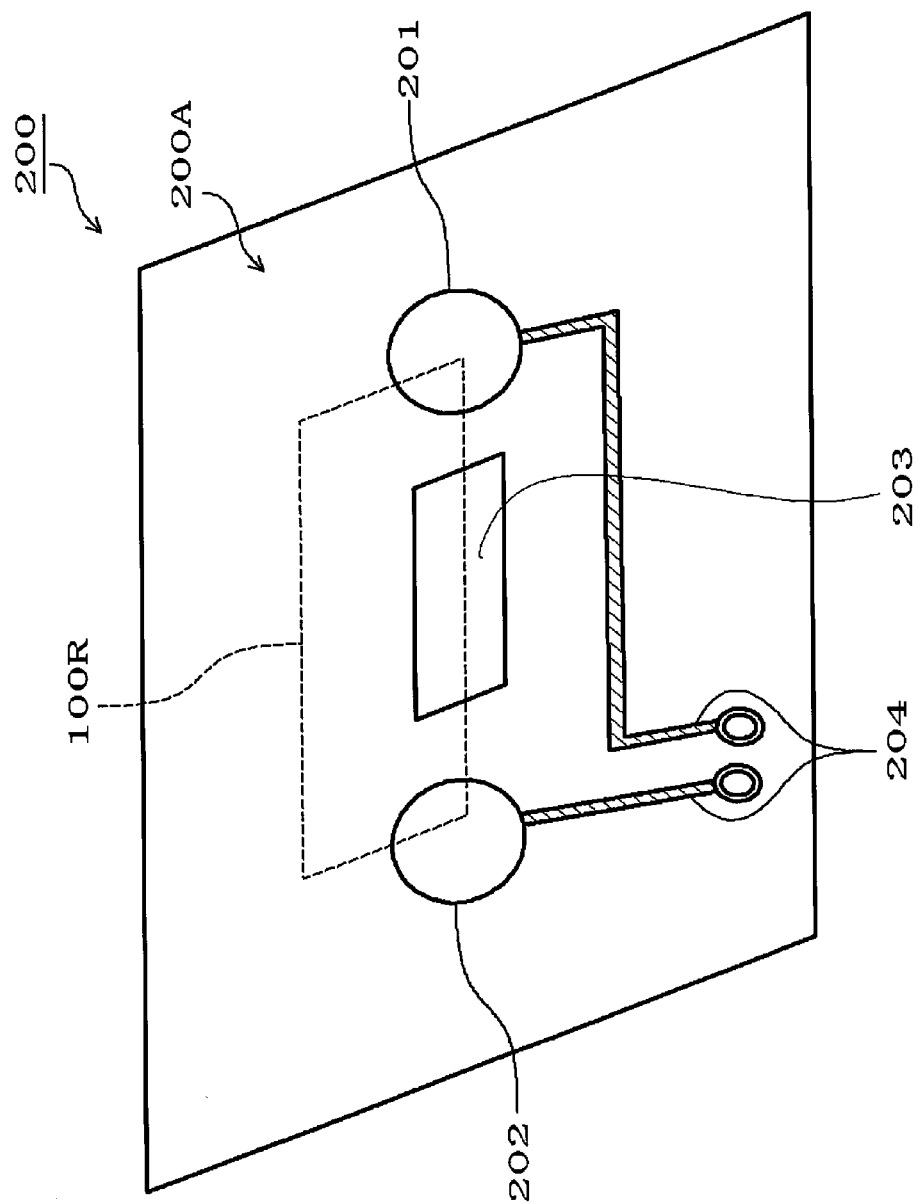
FIG. 6 is an oblique view of the mounting face of a mounting board 200 pertaining to the first embodiment.

Next, the configuration of the mounting board pertaining to the first embodiment will be described though reference to the drawings. FIG. 6 is an oblique view of the mounting face of a mounting board 200 pertaining to the first embodiment. In FIG. 6, the region where the light emitting device 100 is mounted is shown as a mounting region 100R.

As shown in FIG. 6, the mounting board 200 has the mounting face mounting face 200A, a first land 201, a second land 202, a third land 203, and an electrical circuit 204.

The light emitting device 100 is mounted on the mounting face 200A. The first land 201 is a metal member for connecting the first terminal part 42. The second land 202 is a metal member for connecting the second terminal part 52. The third land 203 is a metal member for connecting the base part 43. Copper foil or the like can be used, for example, as the first to third lands 201 to 203. The surfaces of the first to third lands 201 to 203 form part of the mounting face 200A.

The electrical circuit 204 is connected to the first land 201 and the second land 202. Consequently, the first land 201 functions as an external terminal corresponding to the first terminal part 42, and the second land 202 functions as an external terminal corresponding to the second terminal part 52. Meanwhile, the electrical circuit 204 is not connected to the third land 203, and is in fact electrically isolated from the third land 203. Accordingly, the third land 203 does not function as an external terminal, and is a member that is just for providing the third solder fillets 303 (discussed below).

Configuration of Circuit Board

Figure 7:
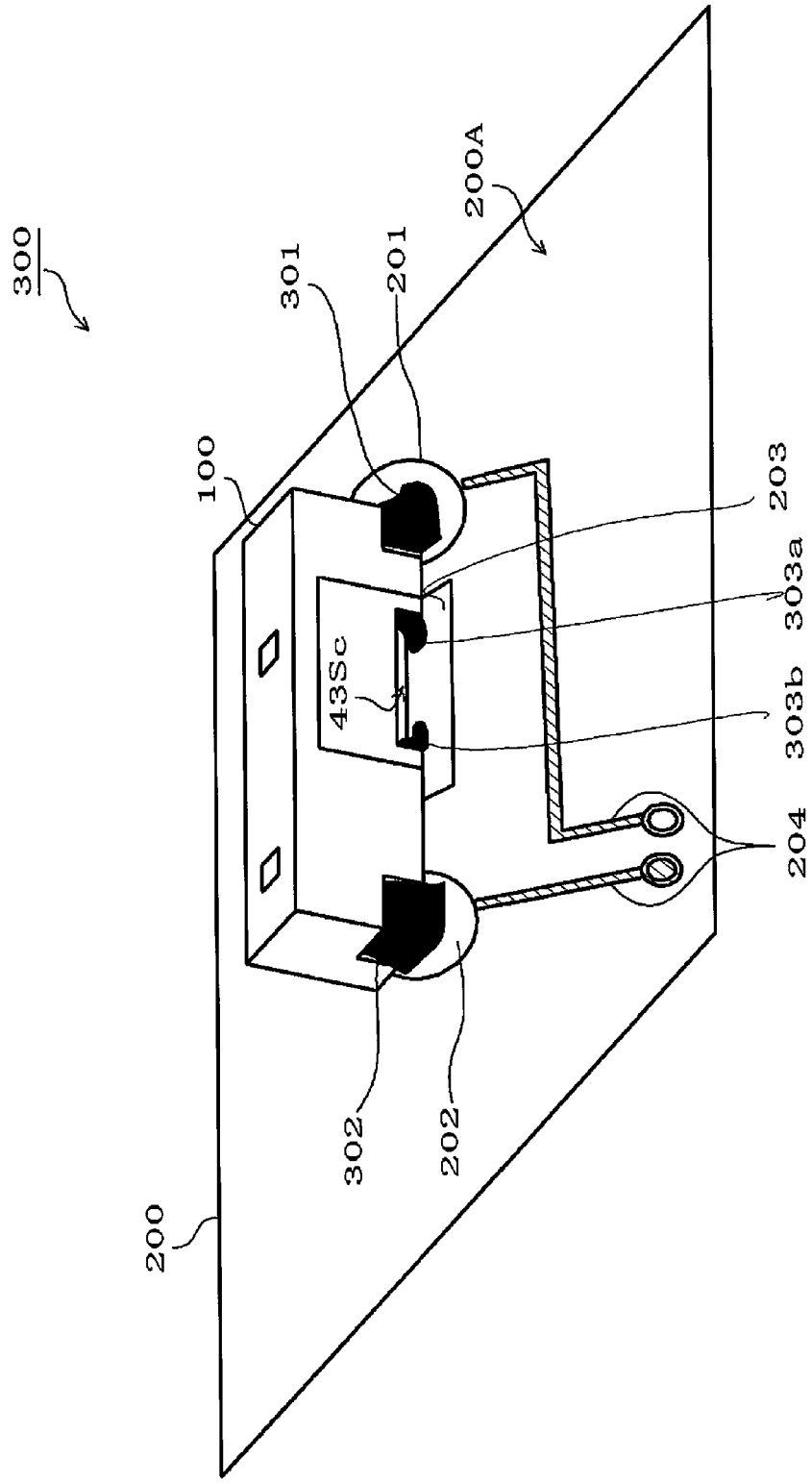
FIG. 7 is an oblique view of the mounting face of a circuit board 300 pertaining to the first embodiment.

Next, the configuration of the circuit board pertaining to the first embodiment will be described through reference to the drawings. FIG. 7 is an oblique view of the mounting face of a circuit board 300 pertaining to the first embodiment.

As shown in FIG. 7, the circuit board 300 comprises the light emitting device 100, the mounting board 200, the first solder fillet 301, a second solder fillet 302, and the pair of third solder fillets 303a and 303b. The first to third solder fillets 301 to 303b are formed by reflow soldering using a solder material that contains a flux.

The first solder fillet 301 is formed spanning from the mounting face 200A to the rear face 20D and the first side face 20E$_1$. The first solder fillet 301 is held in the interior of the first terminal concavity 42S. Consequently, the first terminal part 42 and the first land 201 are electrically and mechanically connected.

The second solder fillet 302 is formed spanning from above the mounting face 200A to the rear face 20D and the second side face 20E$_2$. The second solder fillet 302 is packed in the interior of the second terminal concavity 52S. Consequently, the second terminal part 52 and the second land 202 are electrically, mechanically, and thermally connected.

The pair of third solder fillets 303a and 303b are disposed in the interior of the concavity 43S. More specifically, the third solder fillet 303a is formed spanning from the mounting face 200A to the first inner wall 43Sa, and the third solder fillet 303b is formed spanning from the mounting face 200A to the second inner wall 43Sb. The third solder fillet 303a and the third solder fillet 303b are opposite one another. The third solder fillet 303a and the third solder fillet 303b mechanically and thermally connect the base part 43 and the third land 203. The third inner wall 43Sc, meanwhile, is exposed on the outside of the light emitting device 100.

Method for Manufacturing Circuit Board

Next, the method for manufacturing the circuit board pertaining to the first embodiment will be described through reference to the drawings. The light emitting device 100 pertaining to the first embodiment is held in an embossed tape provided with a concave compartment for holding the light emitting device 100. A plurality of concave compartments are provided to the embossed tape, with each compartment holding one device so that the bottom face 20A of the light emitting device 100 does not come into contact with the bottom face of the concave compartment.

Figure 8A:
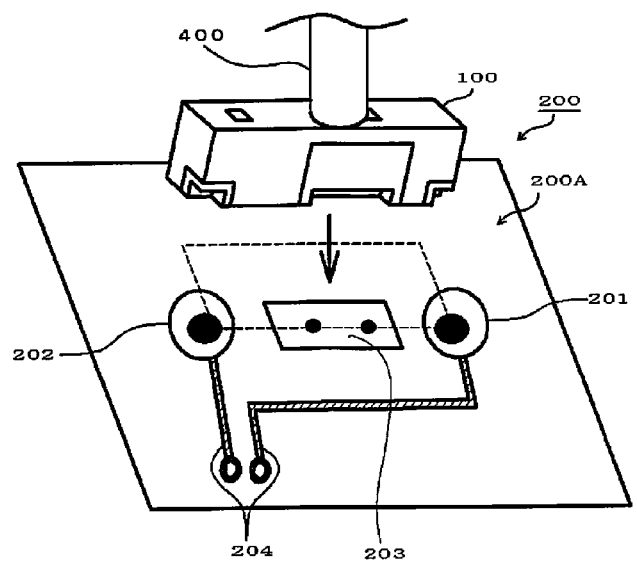
FIG. 8A is a diagram illustrating a method for manufacturing the circuit board 300 pertaining to the first embodiment.
Figure 8B:
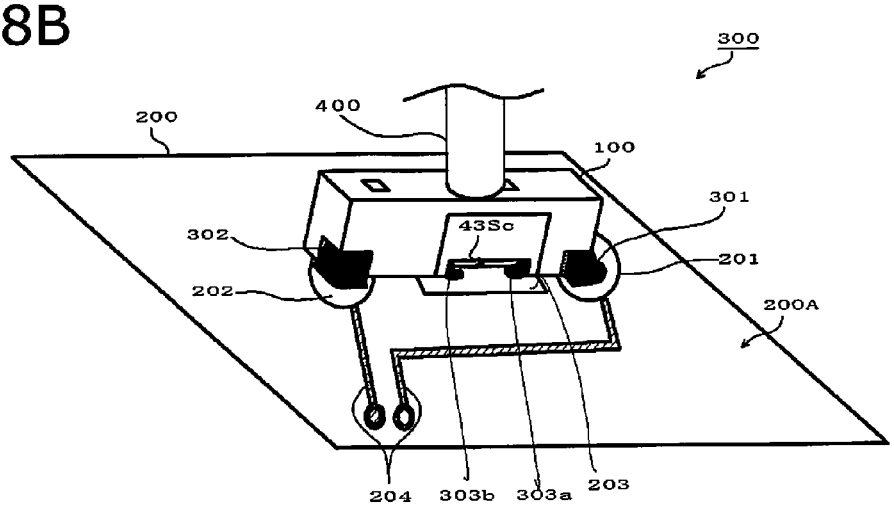
FIG. 8B is a diagram illustrating a method for manufacturing the circuit board 300 pertaining to the first embodiment.

The device that conveys the light emitting device 100 has a nozzle for chucking the light emitting device 100, and the shape of the nozzle is a substantially cylindrical tube shape. The distal end of the nozzle is circular, there is an opening near the center of the circle, and air can be drawn in through this opening. The suction of the nozzle chucks the top face 20B of the light emitting device 100 held in the embossed tape. As shown in FIGS. 8A and 8B, the light emitting device 100, whose top face 20B has been chucked, is conveyed to and mounted on the mounting board 200 by moving the nozzle. It is preferable here for the distal end of the nozzle not to come into contact with the first exposed part 44 in this chucking.

The mounting process will now be described in detail. The mounting board 200 has the first land 201, the second land 202, and the third land 203, solder material containing flux is provided at specific locations, and the light emitting device 100 is placed on the mounting board 200 so that the first terminal part 42 of the light emitting device 100 comes into contact with the solder material on the first land 201, the second terminal part 52 with the solder material on the second land 202, and the base part 43 with the solder material on the third land 203. When the light emitting device 100 is placed on the mounting board 200, the nozzle presses the top face 20B to the mounting board 200 side.

Method for Manufacturing Light Emitting Devices

Figure 9A:
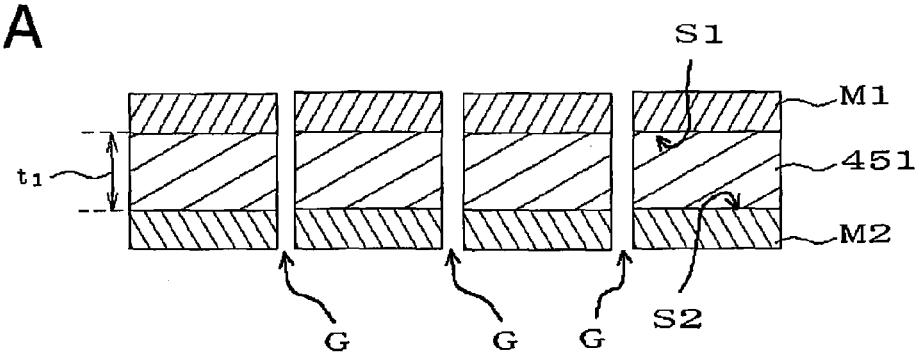
FIG. 9A is a diagram illustrating a method for manufacturing the light emitting device 100 pertaining to the first embodiment.
Figure 9B:
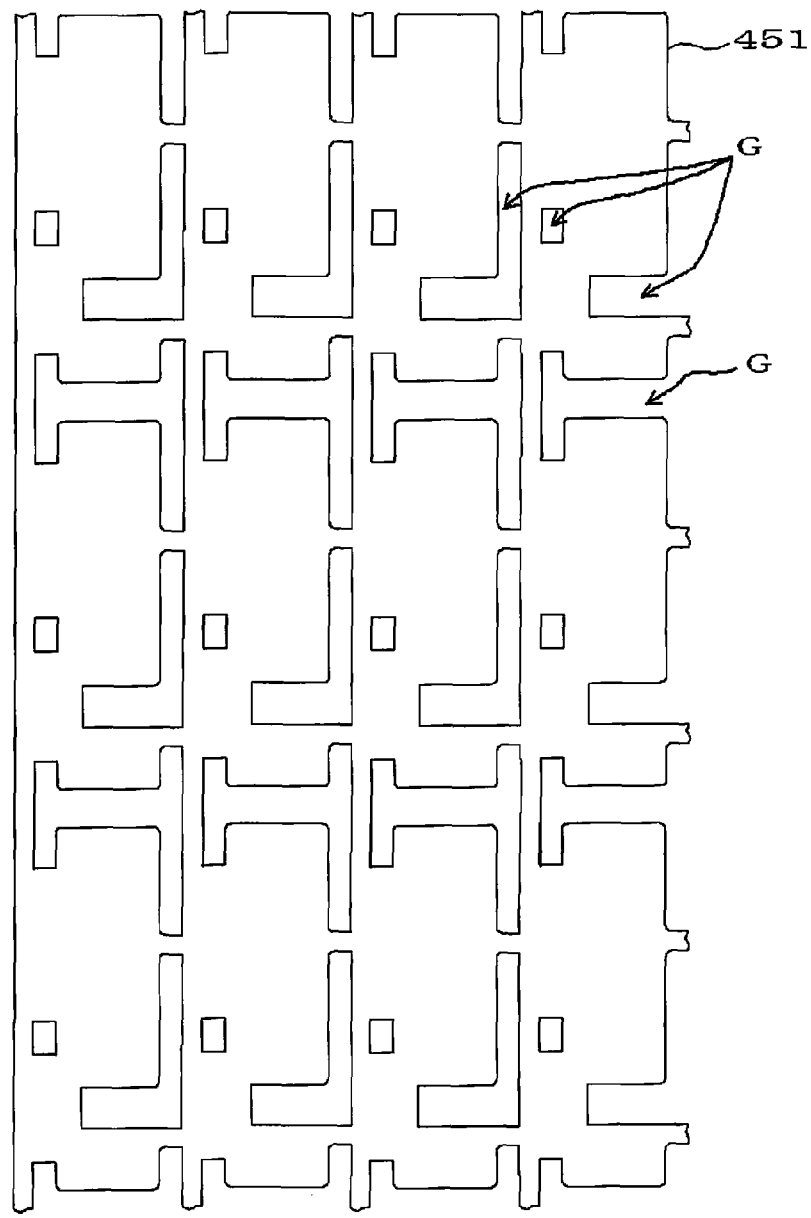
FIG. 9B is a diagram illustrating a method for manufacturing the light emitting device 100 pertaining to the first embodiment.
Figure 10A:
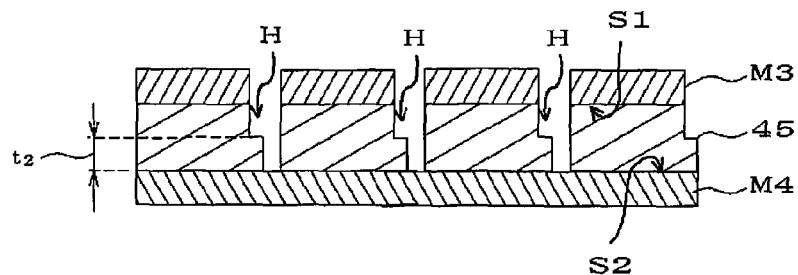
FIG. 10A is a diagram illustrating a method for manufacturing the light emitting device 100 pertaining to the first embodiment.
Figure 10B:
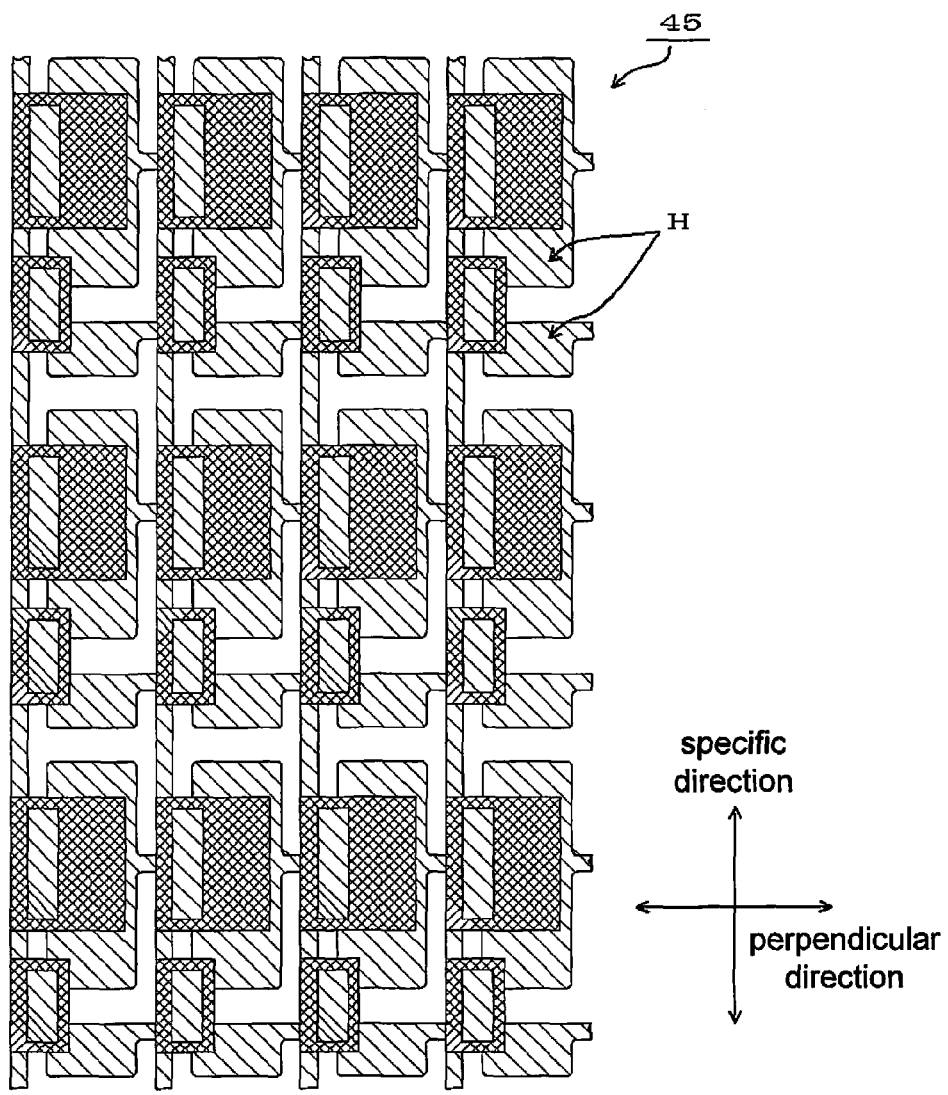
FIG. 10B is a diagram illustrating a method for manufacturing the light emitting device 100 pertaining to the first embodiment.
Figure 11:
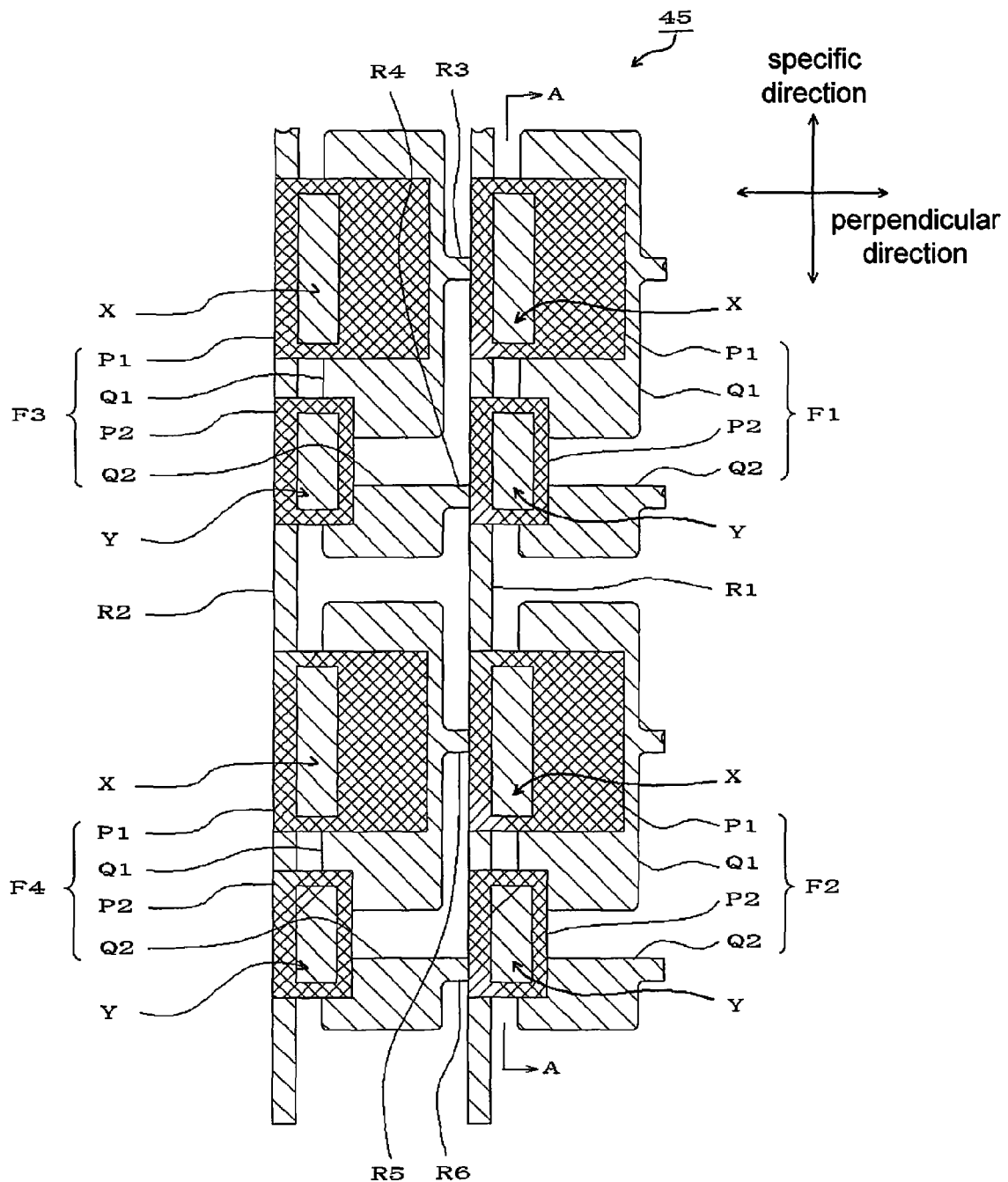
FIG. 11 is a detail view of a lead frame 45 pertaining to the first embodiment.
Figure 12:
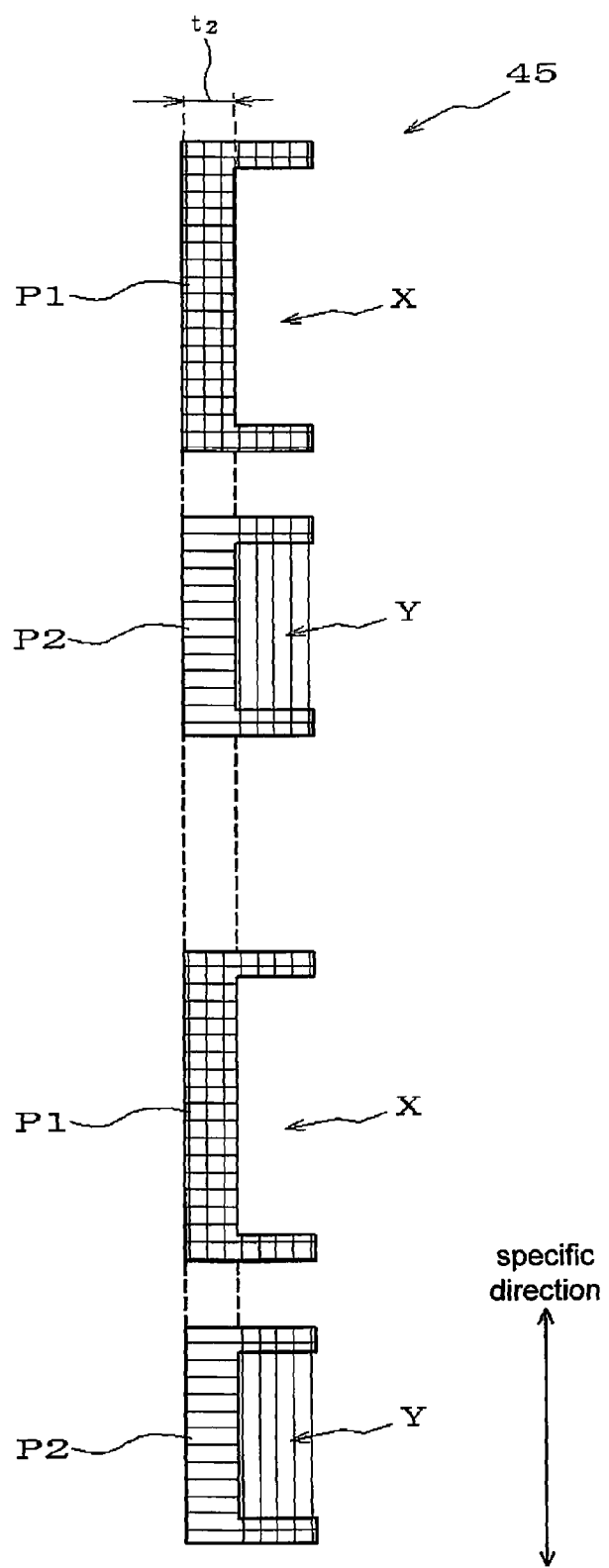
FIG. 12 is a cross section along the A-A line in FIG. 11.
Figure 13:
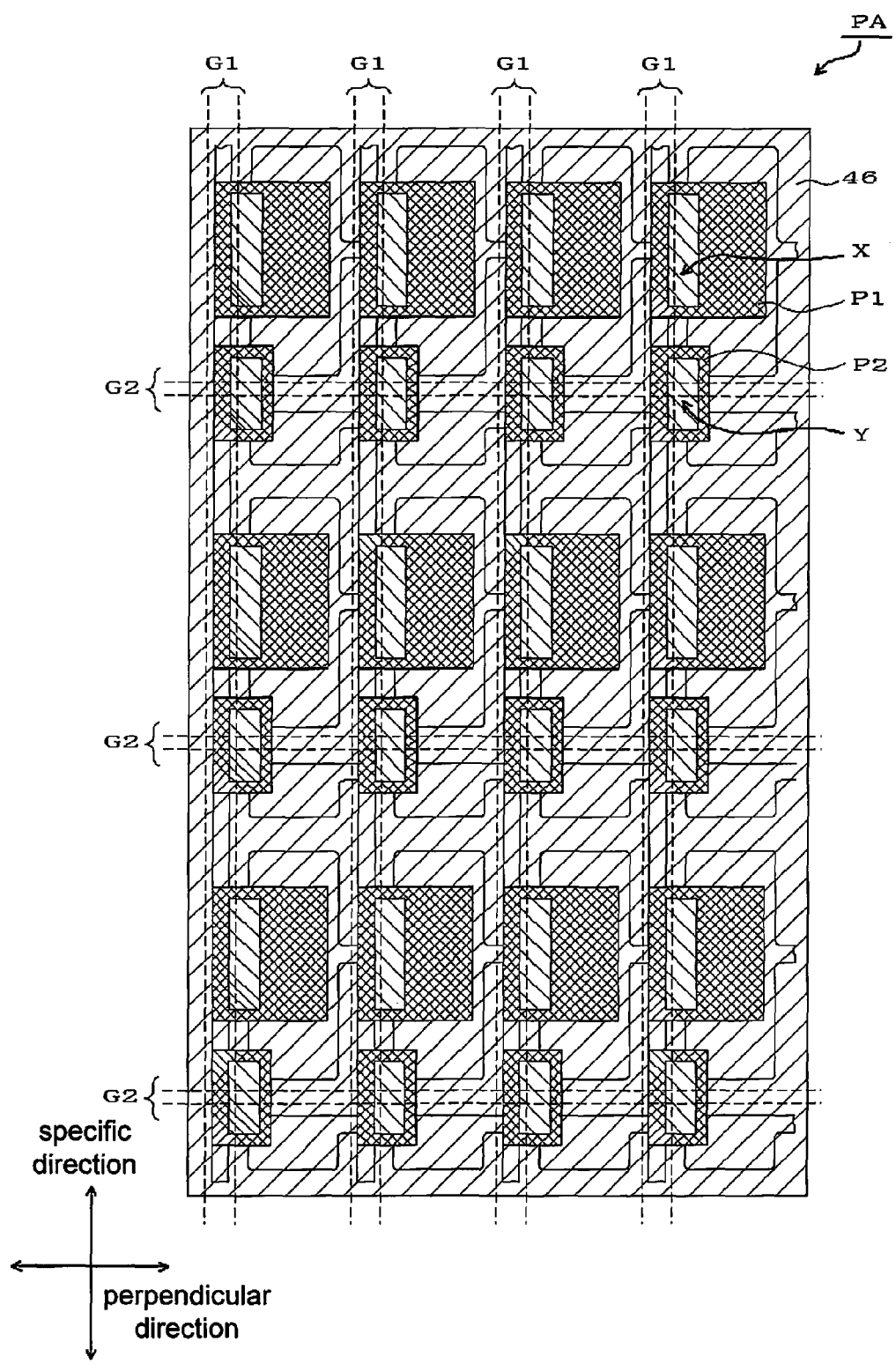
FIG. 13 is a diagram illustrating a method for manufacturing the light emitting device 100 pertaining to the first embodiment.

A method for manufacturing a plurality of the light emitting devices 100 pertaining to the first embodiment all at once will be described through reference to the drawings. FIG. 9A is a cross section of a thin metal plate 451, and FIG. 9B is a plan view of the thin metal plate 451. FIG. 10A is a cross section of a lead frame 45, and FIG. 10B is a plan view of the lead frame 45. FIG. 11 is a detail view of the lead frame 45. FIG. 12 is a cross section along the A-A line in FIG. 11. FIG. 13 is a plan view of a light emitting device package array PA pertaining to this embodiment.

First, the thin metal plate 451 is readied, which has a first main face S1 and a second main face S2 provided opposite the first main face S1. In this embodiment, the thin metal plate 451 has a thickness $t_1$ (such as about 0.5 mm).

Next, as shown in FIG. 9A, a first mask M1 is formed over the first main face S1, and a second mask M2 is formed over the second main face S2. The first mask M1 and the second mask M2 are formed in a specific pattern with respect to each other, and the first main face S1 and the second main face S2 are etched at the same time. Consequently, as shown in FIG. 9B, etching holes G are formed in the thin metal plate 451. This etching can be accomplished by dry or wet etching. An etchant that is suitable for the material of the thin metal plate 451 should be selected.

Next, as shown in FIG. 10A, a third mask M3 is formed over the first main face S1, and a fourth mask M4 is formed over the second main face S2. The third mask M3 has a specific pattern. The fourth mask M4 covers the entire second main face S2, and only the first main face S1 is etched. As shown in FIG. 10B, this completes the lead frame 45, which has etching concavities H formed in the first main face S1. The depth of the etching concavities H is about 0.3 mm, for example. Accordingly, the portion of the thin metal plate 451 in which the etching concavities H are formed has a thickness $t_2$ (such as about 0.2 mm) that is less than the thickness $t_1$.

The configuration of the lead frame 45 formed in this manner will be described in detail through reference to the drawings. FIG. 11 is a detail view of part of the lead frame 45 shown in FIG. 10B. As shown in FIG. 11, the lead frame 45 has a first frame part F1, a second frame part F2, a third frame part F3, and a fourth frame part F4.

The first frame part F1 and the second frame part F2 are adjacent to each other in a specific direction, and are linked by a first linking frame R1. The third frame part F3 and the fourth frame part F4 are adjacent to each other in a specific direction, and are linked by a second linking frame R2. The first frame part F1 and the third frame part F3 are adjacent to each other in a perpendicular direction, which is perpendicular to a specific direction (an example of a perpendicular direction), and are linked by a third linking frame R3 and a fourth linking frame R4. The second frame part F2 and the fourth frame part F4 are adjacent to each other in a perpendicular direction, and are linked by a fifth linking frame R5 and a sixth linking frame R6.

The first to fourth frame parts F1 to F4 each have the same configuration, and include a first thick-walled part P1, a second thick-walled part P2, a first thin-walled part Q1, and a second thin-walled part Q2.

The first thick-walled part P1 has a first thickness $t_1$ (that is, the thickness of the thin metal plate 451). In a later step, the first thick-walled part P1 is cut with a dicing saw to form the base part 43. The second thick-walled part P2 has the first thickness $t_1$. The second thick-walled part P2 is isolated from the first thick-walled part P1 in a specific direction. In a later step, the second thick-walled part P2 is cut with a dicing saw to form the first terminal part 42 and the second terminal part 52.

The first thin-walled part Q1 has a second thickness $t_2$ (that is, the thickness of the portion of the thin metal plate 451 where the etching concavities H are formed). The first thin-walled part Q1 is linked to the first thick-walled part P1 and the second thick-walled part P2. The first thin-walled part Q1 corresponds to the first connector 41 of the light emitting device 100. The second thin-walled part Q2 has the second thickness $t_2$ (that is, the thickness of the portion of the thin metal plate 451 where the etching concavities H are formed). The second thin-walled part Q2 is linked to the first thick-walled part P1, and is isolated from the first thin-walled part Q1 via the etching holes G in a specific direction (see FIG. 9). The second thin-walled part Q2 corresponds to the second connector 51 of the light emitting device 100.

In this embodiment, in a plan view of the lead frame 45, a one-sided etching concavity X, which is a part of the etching concavity H, is formed on the inside of the first thick-walled part P1 of each of the frame parts F. As shown in FIG. 12, the portion of the first thick-walled part P1 where the one-sided etching concavities X are formed has the second thickness $t_2$. In a later step, the one-sided etching concavities X are cut with a dicing saw to form the concavity 43S (see FIG. 13).

Figure 14:
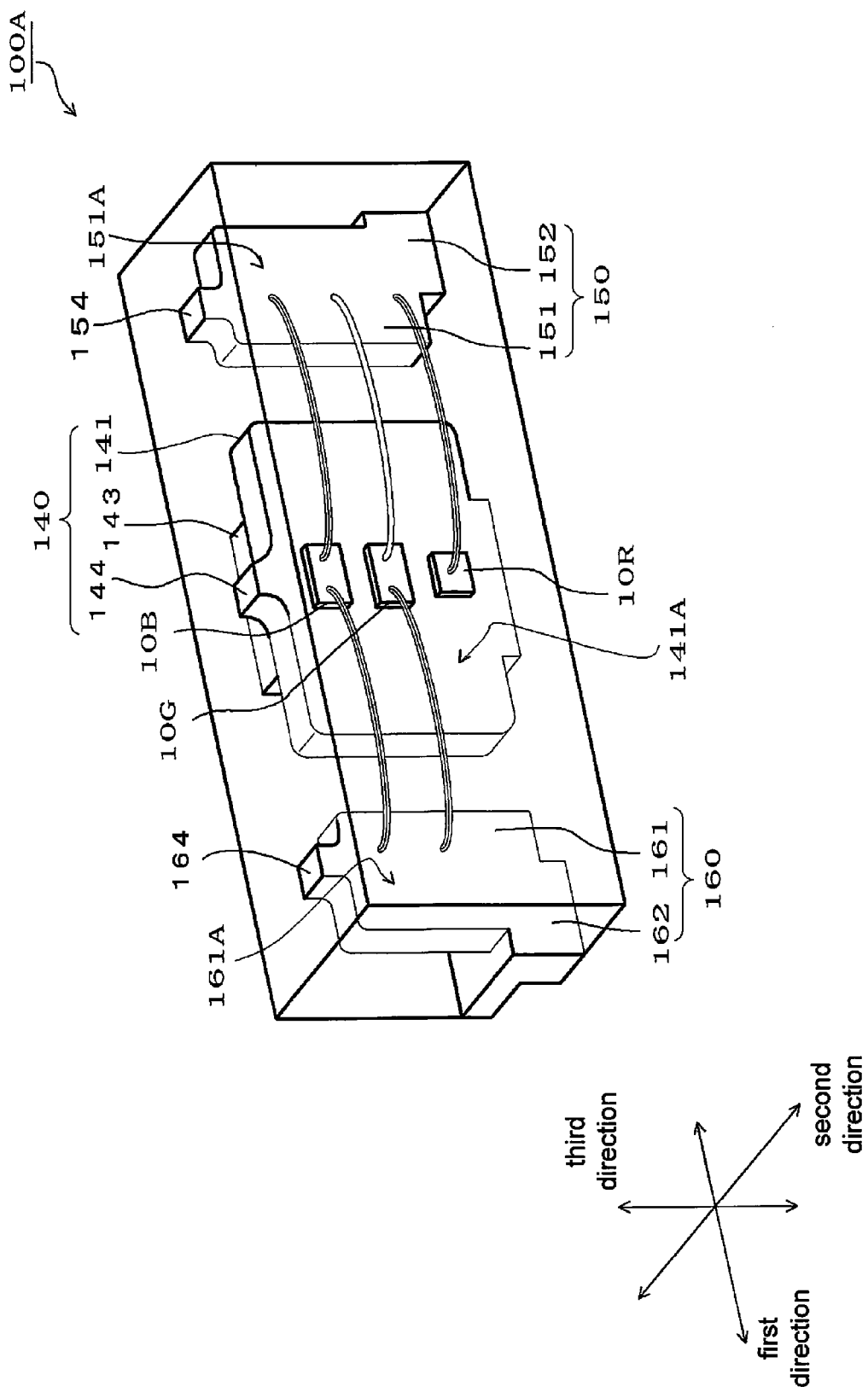
FIG. 14 is an oblique see-through view of a light emitting device 100A pertaining to a second embodiment, as seen from the front.

Similarly, in this embodiment, in a plan view of the lead frame 45D, a one-sided etching concavity Y, which is a part of the etching concavity H, is formed on the inside of the second thick-walled part P2 of each of the frame parts F. As shown in FIG. 14, the portion of the second thick-walled part P2 where the one-sided etching concavities Y are formed has the second thickness $t_2$. In a later step, the one-sided etching concavities Y are cut with a dicing saw to form the first terminal concavity 42S and the second terminal concavity 52S (see FIG. 13).

In this embodiment, the first thin-walled part Q1 of the third frame part F3 is linked via the third linking frame R3 to the first thick-walled part P1 of the first frame part F1. The second thin-walled part Q2 of the third frame part F3 is linked via the fourth linking frame R4 to the second thick-walled part P2 of the first frame part F1. Similarly, the first thin-walled part Q1 of the fourth frame part F4 is linked via the fifth linking frame R5 to the first thick-walled part P1 of the second frame part F2. The second thin-walled part Q2 of the fourth frame part F4 is linked via the sixth linking frame R6 to the second thick-walled part P2 of the second frame part F2.

The first to sixth linking frames R1 to R6 are cut with a dicing saw in a later step (see FIG. 13). The fifth and sixth linking frames R5 and R6 are cut to form the first exposed part 44 and the second exposed part 54. As shown in FIG. 11, the portion of the first thick-walled part P1 that is linked to the third linking frame R3, and the portion of the second thick-walled part P2 that is linked to the fourth linking frame R4 are disposed in a specific direction, and a cutting allowance is left for dicing.

Next, the lead frame 45 is disposed in a metal mold. More specifically, the lead frame 45 is sandwiched between upper and lower molds.

Next, the molding material that makes up the molded article 30 (such as a thermosetting resin) is injected between the upper and lower molds.

Next, the molding material is transfer molded by being heated at a specific temperature. As shown in FIG. 13, this completes a light emitting device package array PA made up of the lead frame 45 and a molded board 46 in which the lead frame 45 is embedded. Care should be taken with the light emitting device package array PA so that the first thick-walled part P1 and the one-sided etching concavities X, and the second thick-walled part P2 and the one-sided etching concavities Y, are exposed from the molded board 46.

Then, as shown in FIG. 13, a dicing saw is used to cut the light emitting device package array PA along cutting lines G1 and G2 of a specific width. This allows a plurality of light emitting devices 100 to be manufactured all at once.

Action and Effect (1) The light emitting device 100 pertaining to the first embodiment comprises the light emitting element 10 and a package that is made up of the molded article 30 and leads including the first terminal part 42 and the second terminal part 52, and that has the bottom face 20A, the top face 20B that is opposite the bottom face, the front face 20C that is a light emission face contiguous with the bottom face 20A and the top face 20B, the rear face 20D that is opposite the front face 20C, and the first side face $20E_1$ and the second side face $20E_2$ that are contiguous with the front face 20C and the rear face 20D, respectively. The leads have the first lead 40, which has the first connector 41 on which the light emitting element 10 is placed, and the second lead 50, which has the second connector 51 and the second terminal part 52 that are electrically connected to the light emitting element 10. The first terminal part 42 and the second terminal part 52 are exposed at the bottom face 20A, and the first lead 40 has the first exposed part 44 that is exposed at the top face 20B.

Therefore, when pressure is applied from the top face 20B side toward the interior of the package 20, the pressure exerted around the first exposed part 44, including the first exposed part 44, is transmitted through the molded article 30, from the second terminal part 52 to the mounting board, so the top face 20B can be supported. This is turn makes it less likely that the top face 20B will be bent toward the interior of the package 20, allowing a side-view type of light emitting device to be obtained with less cracking in the top face 20B and at a higher yield.

Also, cracking caused by the bending of the top face 20B can be suppressed in the step of mounting the side-view light emitting device 100 on the mounting board 200 with a nozzle. Also, the nozzle tends to come into contact with the first exposed part 44 in the step of mounting the light emitting device 100 on the mounting board 200 with the nozzle. If the light emitting device 100 is mounted while the nozzle is in contact with the first exposed part 44, the first exposed part 44 can bear the pressure exerted by the nozzle, so the top face 20B will be resistant to bending toward the interior of the package 20.

(2) With the light emitting device 100 pertaining to the first embodiment, the first lead 40 has the base part 43 that is linked to the lower end of the first connector 41, and the base part 43 is exposed at the bottom face 20A.

Therefore, when pressure is applied from the top face 20B side toward the interior of the package 20, the base part 43 is exposed at the bottom face 20A, and consequently the pressure exerted around the first exposed part 44, including the first exposed part 44, is exerted directly on the mounting board from the package 20, so the first exposed part 44 can support the top face 20B more stably. This in turn makes the top face 20B less likely to bend toward the interior of the package 20, and further suppresses cracking on the top face 20B.

(3) With the light emitting device 100 pertaining to the first embodiment, the first exposed part 44 is formed so as to be opposite the base part 43 with the first connector 41 in between.

Therefore, when pressure is applied from the top face 20B side toward the interior of the package 20, the pressure exerted around the first exposed part 44, including the first exposed part 44, is transmitted linearly toward the base part 43, so the first exposed part 44 can support the top face 20B more stably. This in turn makes the top face 20B less likely to bend toward the interior of the package 20, and further suppresses cracking on the top face 20B.

(4) With the light emitting device 100 pertaining to the first embodiment, the first lead 40 has the first terminal part 42.

Therefore, when pressure is applied from the top face 20B side toward the interior of the package 20, the first terminal part 42 is exposed at the bottom face 20A, and as a result the pressure exerted around the first exposed part 44, including the first exposed part 44, is transmitted directly from the package 20 to the mounting board, so the first exposed part 44 can support the top face 20B more stably. This in turn makes the top face 20B less likely to bend toward the interior of the package 20, and further suppresses cracking on the top face 20B. Also, with the light emitting device 100 pertaining to the first embodiment, the first terminal part 42 is successively-exposed at the bottom face 20A and the first side face $20E_1$, and the second terminal part 52 is successively-exposed at the bottom face 20A and the second side face $20E_2$. Therefore, it is possible to parry pressure applied on the periphery of the first exposed part 44 from either end of the package 20 to the mounting board 200.

(5) With the light emitting device 100 pertaining to the first embodiment, the second lead 50 has a second exposed part that is exposed at the top face 20B.

Therefore, pressure exerted around the first exposed part 44, including the first exposed part 44, is transmitted through the molded article 30, from the second terminal part 52 to the mounting board, so the top face 20B can be supported better. This in turn makes the top face 20B less likely to bend toward the interior of the package 20, and further suppresses cracking on the top face 20B, allowing a side-view type of light emitting device to be obtained at a higher yield.

(6) With the light emitting device 100 pertaining to the first embodiment, the second exposed part is formed so as to be opposite the second terminal part 52, with the second connector 51 in between.

Therefore, when pressure is applied from the top face 20B side toward the interior of the package 20, the pressure exerted around the second exposed part, including the second exposed part, is transmitted linearly toward the second end face 52B, so the pressure exerted around the second exposed part 54, including the second exposed part 54, is exerted linearly from the molded article 30 on the mounting board, so the second exposed part 54 can support the top face 20B more stably. This in turn further suppresses cracking on the top face 20B.

(7) In a method for manufacturing the circuit board 300 pertaining to the first embodiment, the light emitting device 100 is chucked at its top face 20B by a nozzle 400 and conveyed over the mounting board 200 so that the nozzle 400 and the first exposed part 44 do not come into contact with each other, and the first terminal part 42 and the second terminal part 52 are mounted so as to be in contact with the first land 201 and the second land 202, respectively.

Therefore, the nozzle presses while in contact with the first exposed part 44 that supports the top face 20B, so the top face 20B is less likely to bend toward the interior of the package 20, and cracking of the top face 20B can be suppressed.

Second Embodiment

Next, a second embodiment will be described through reference to the drawings. The difference between the first and second embodiments is that the light emitting device 100 comprises three terminal parts. The following description will focus on this difference.

Configuration of Light Emitting Device

Figure 15:
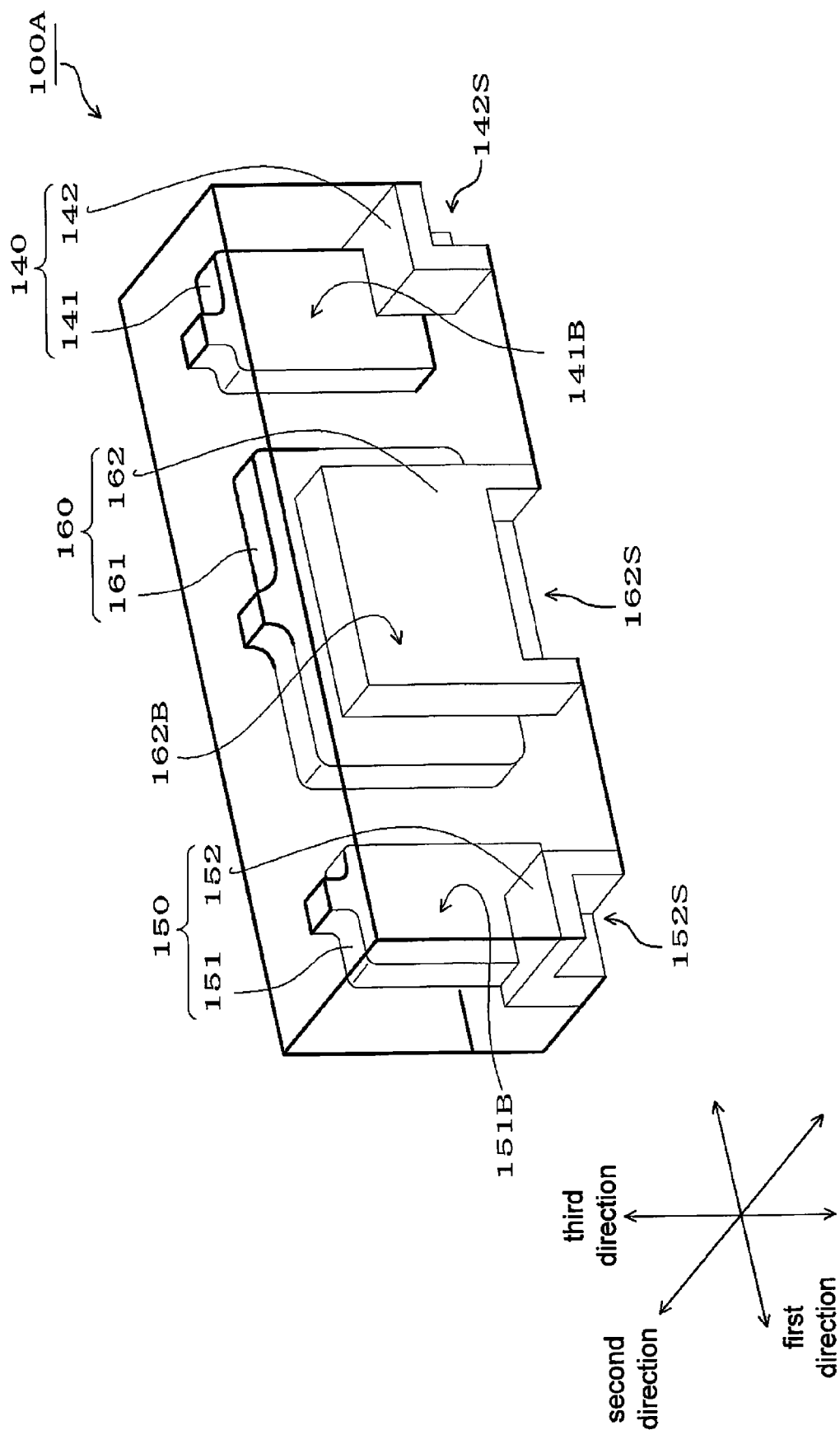
FIG. 15 is an oblique see-through view of the light emitting device 100A pertaining to the second embodiment, as seen from the rear.

FIG. 14 is an oblique see-through view of a light emitting device 100A pertaining to the second embodiment, as seen from the front. FIG. 15 is an oblique see-through view of the light emitting device 100A pertaining to the second embodiment, as seen from the rear.

As shown in FIGS. 14 and 15, the light emitting device 100A comprises a first lead 140, a second lead 150, a third lead 160, a blue light emitting element 10B, a green light emitting element 104 and a red light emitting element 10R.

The first lead 140 (an example of a "first lead") has a first connector 141 (an example of a "first connector") and a base part 143. The second lead 150 (an example of a "second lead") has a second connector 151 (an example of a "second connector"), a second terminal part 152 (an example of a "second terminal part"), and a second terminal concavity 152S (an example of a "second terminal concavity"). The third lead 160 has a third connector 161 that is electrically connected to light emitting elements, a first terminal part 142 (an example of a "first terminal part"), and a first terminal concavity 1425 (an example of a "first terminal concavity"). A placement component 161 and an exposed part 162 are provided. The first terminal part 142, the second terminal part 152, and the base part 143 are each electrically connected to a mounting board (not shown), and thereby function as external terminals.

The blue light emitting element 10B, the green light emitting element 104 and the red light emitting element 10R are placed on a placement face 141A of the first connector 141. The blue light emitting element 10B is electrically connected to a third connection face 161A of the third connector 161, and the green light emitting element 10G to a second connection face 151A of the second connector 151. The red light emitting element 10R is electrically connected to the second connection face 151A and the third connection face 161A.

Action and Effect

With the light emitting device 100A pertaining to the second embodiment, a package 120 has the third lead 160, which has the third connector 161 that is electrically connected to the light emitting elements 10, and the third lead 160 also has the first terminal part 142. Again with this light emitting device 100A, when pressure is applied from the top face 120B side toward the interior of the package 120, the pressure that is exerted around a first exposed part 144, including the first exposed part 144, is transmitted via a molded article 130, from the second terminal part 152 to the mounting board, so the top face 120B can be supported.

Also, with the light emitting device 100A pertaining to the second embodiment, because the third lead has the first terminal part 142, when pressure is applied from the top face 120B side toward the interior of the package 120, the pressure that is exerted around the first exposed part 144, including the first exposed part 144, is transmitted via the molded article 130, from the first terminal part 142 to the mounting board, so the top face 120B can be supported better.

Also, with the light emitting device 100A pertaining to the second embodiment, the third lead has a third exposed part 164 that is exposed at the top face 120B. Therefore, the pressure that is exerted around the third exposed part 164, including the third exposed part 164, is transmitted via the molded article 130, from the second terminal part 152 to the mounting board, so the top face 120B can be supported better.

Also, with the light emitting device 100A pertaining to the second embodiment, the third exposed part 164 is formed so as to be opposite the first terminal part 142, with the third connector 161 in between. Therefore, the pressure that is exerted around the first exposed part 144, including the third exposed part 164, is transmitted linearly toward the first terminal part 142, so the third exposed part 164 can support the top face 120B more stably. This in turn further suppresses cracking of the top face 120B when pressure is exerted from the top face 120B side toward the interior of the package 120.

Third Embodiment

Next, a third embodiment will be described through reference to the drawings. The difference between the first and third embodiments is that a part of each of the first lead 40 and the second lead 50 extends toward the rear face 20D. The following description will focus on this difference.

Configuration of Light Emitting Device

Figure 16:
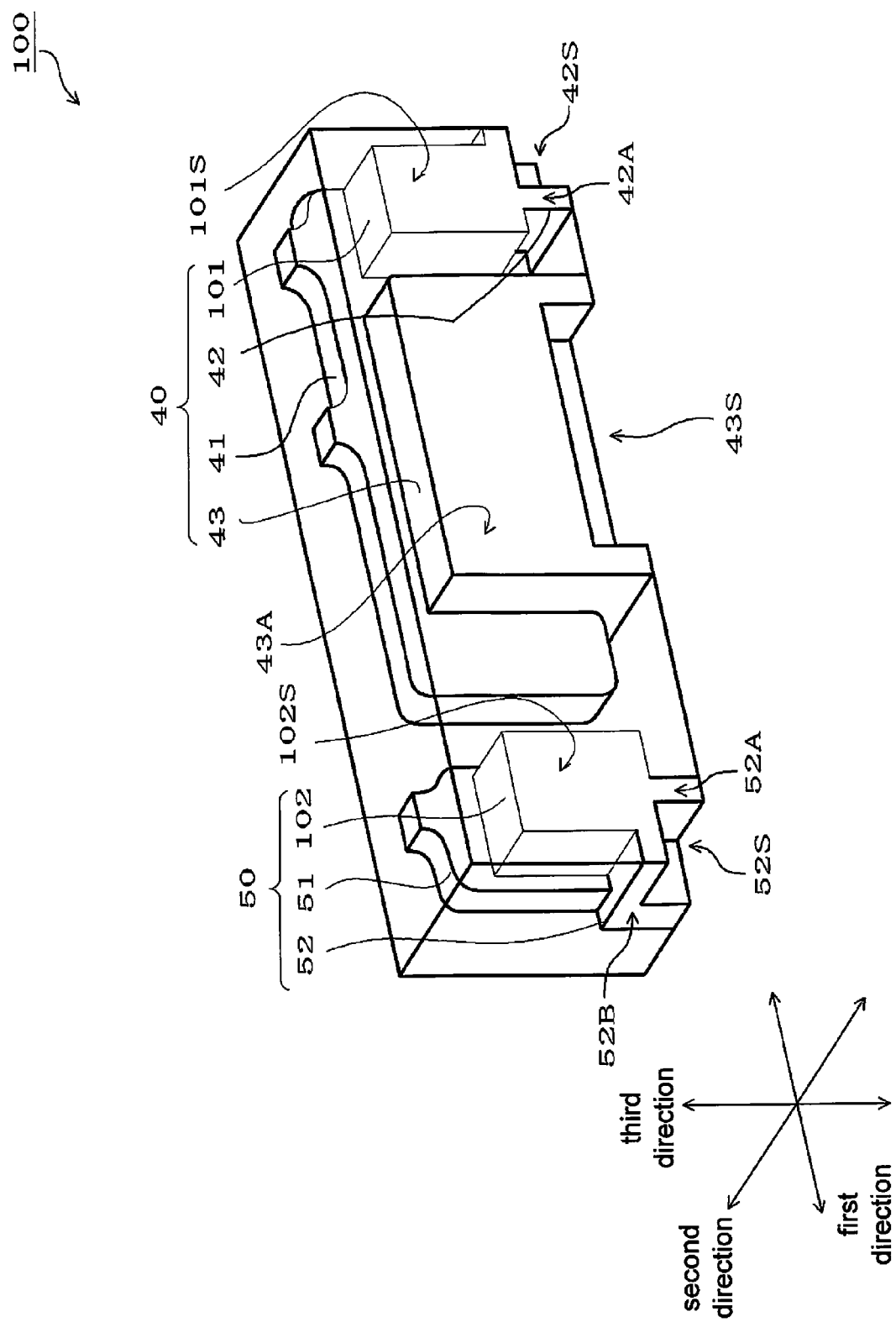
FIG. 16 is an oblique see-through view of a light emitting device 100 pertaining to a third embodiment, as seen from the rear.

FIG. 16 is an oblique see-through view of a light emitting device 100 pertaining to a third embodiment, as seen from the rear. As shown in FIG. 16, with the light emitting device 100, the first lead 40 has a first extension 101, and the second lead 50 has a second extension 102.

The first extension 101 is disposed on the first connector 41, and is connected to the first terminal part 42. The first extension 101 extends from the surface of the first connector 41 on the rear face 20D side, toward the rear face 20D, and is exposed from the molded article 30 at the rear face 20D. The first extension 101 has a first extension face 101S that forms part of the rear face 201).

The second extension 102 is disposed on the second connector 51, and is connected to the second terminal part 52. The second extension 102 extends from the surface of the second connector 51 on the rear face 20D side, toward the rear face 20D, and is exposed from the molded article 30 at the rear face 20D. The second extension 102 has a second extension face 102S that forms part of the rear face 20D.

Method for Manufacturing Light Emitting Device

Figure 17:
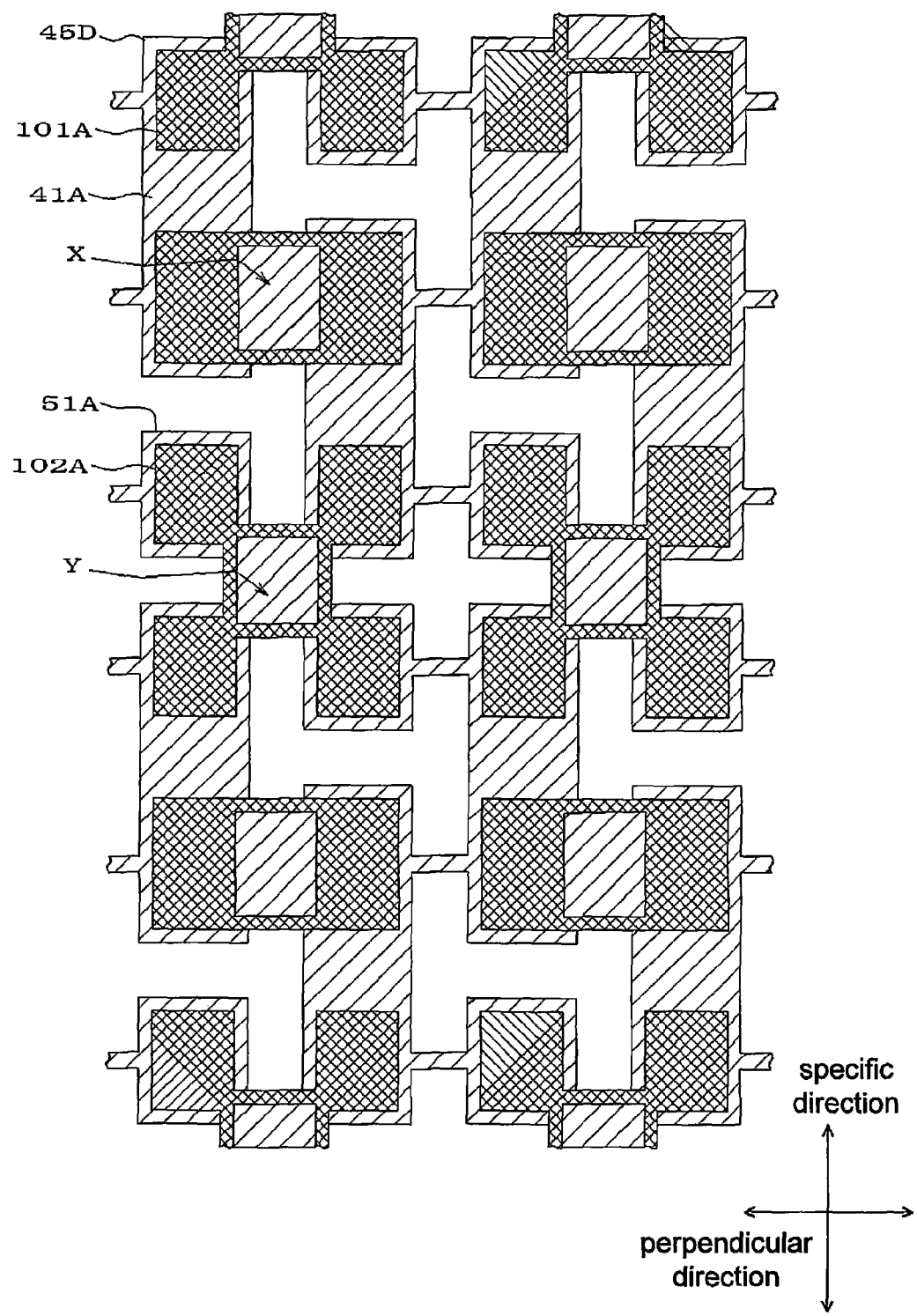
FIG. 17 is a diagram illustrating a method for manufacturing the light emitting device 100 pertaining to the third embodiment.

First, the lead frame 45D shown in FIG. 17 is readied. The lead frame 45D comprises a first extension base 101A and a second extension base 101B. This lead frame 45D can be formed by setting the region in which one-sided etching is performed in order to form a first connection base 41A and a second connection base 51A, as shown in FIG. 17.

With the lead frame 45D pertaining to this embodiment, the one-sided etching concavities X and the one-sided etching concavities Y are set to be larger than the lead frame 45 pertaining to the first embodiment. This raises the dimensional machining limit at which one-sided etching is possible.

Figure 18:
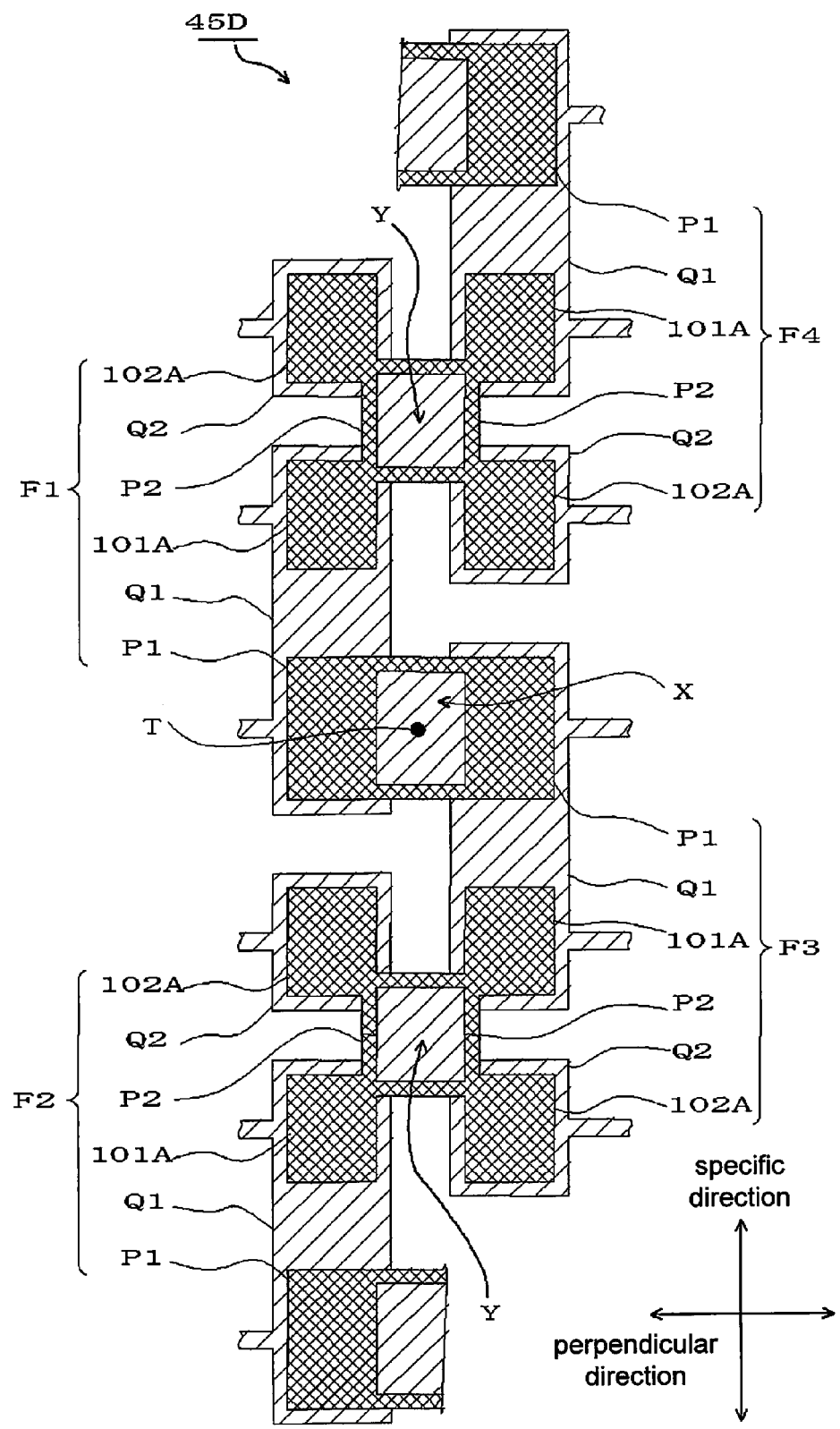
FIG. 18 is a detail view of a lead frame 45C pertaining to the third embodiment.

Thus, the lead frame 45D pertaining to this embodiment has a fundamentally different configuration from that of the lead frame 45 pertaining to the first embodiment. The detailed configuration of the lead frame 45D will now be described through reference to the drawings. FIG. 18 is a detail view of a lead frame 45D. As shown in FIG. 18, the lead frame 45D has first to fourth frame parts F1 to F4. The first frame part F1 and the second frame part F2 are adjacent to each other in a specific direction, but are not linked. Similarly, the third frame part F3 and the fourth frame part F4 are adjacent to each other in a specific direction, but are not linked.

In this embodiment, the third frame part F3 and the fourth frame part F4 are disposed in rotational symmetry with respect to the first frame part F1 and the second frame part F2 around an axis T that is parallel to the thickness direction (a direction that is perpendicular to the specific direction and the perpendicular direction, that is, a direction that is perpendicular to the plane of the drawing). The first thick-walled part P1 of the third frame part F3 is directly linked to the first thick-walled part P1 of the first frame part F1. The second thick-walled part P2 of the third frame part F3 is directly linked to the second thick-walled part P2 of the second frame part F2. The second thick-walled part P2 of the fourth frame part F4 is directly linked to the second thick-walled part P2 of the first frame part F1.

Also, in this embodiment, in a plan view of the lead frame 45D, part of the etching concavities H is formed on the inside of the first thick-walled part P1 of the frame parts F. Consequently, the one-side etching concavities X are formed by linking the first thick-walled part P1 of the third frame part F3 and the first thick-walled part P1 of the first frame part F1.

Similarly, in this embodiment, in a plan view of the lead frame 45D, part of the etching concavities H is formed on the inside of the second thick-walled part P2 of the frame parts. Consequently, the one-side etching concavities Y are formed by linking the second thick-walled part P2 of the first frame part F1 and the second thick-walled part P2 of the fourth frame part F4. Also, the one-side etching concavities Y are formed by linking the second thick-walled part P2 of the second frame part F2 and the second thick-walled part P2 of the third frame part F3.

Figure 19:
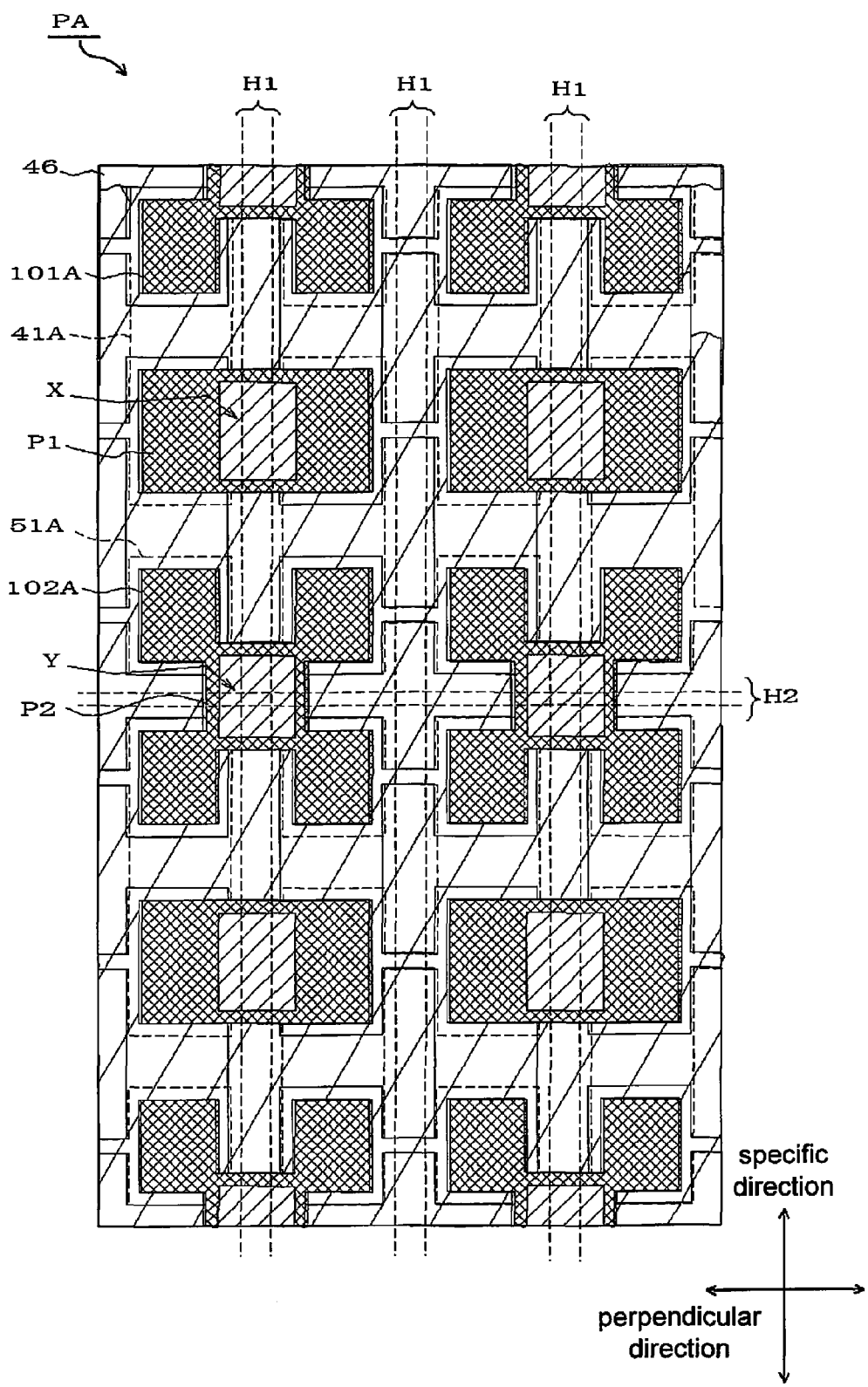
FIG. 19 is a diagram illustrating a method for manufacturing the light emitting device 100 pertaining to the third embodiment.

The portion where the first thick-walled part P1 of the third frame part F3 and the first thick-walled part P1 of the first frame part F1 are linked constitutes a cutting allowance for dicing (see FIG. 19). Similarly, the portion where the second thick-walled part P2 of the third frame part F3 and the second thick-walled part P2 of the second frame part F2 are linked constitutes a cutting allowance for dicing. The portion where the second thick-walled part P2 of the fourth frame part F4 and the second thick-walled part P2 of the first frame part F1 are linked also constitutes a cutting allowance for dicing.

Next, as shown in FIG. 18, the light emitting device package array PA is completed by embedding the lead frame 45D in a molded board 46 by transfer molding. It should be noted that the first thick-walled part P1 and the one-side etching concavities X, and the second thick-walled part P2 and the one-side etching concavities Y are exposed from the molded board 46 in the light emitting device package array PA.

Next, as shown in FIG. 19, the light emitting device package array PA is cut with a dicing saw along cutting lines H1 and H2 having a specific width. Here, the first terminal concavity 42S and the second terminal concavity 52S are formed by cutting the one-side etching concavities Y in a cross shape. The first exposed part 44 and the second exposed part 54 are formed by cutting a seventh linking frame R7 with a dicing saw.

Action and Effect

With the light emitting device 100 pertaining to the third embodiment, the first lead 40 has the first extension 101. The first extension 101 is disposed on the first connector 41, and is connected to the first terminal part 42. Therefore, when pressure is applied from the top face 20B side toward the interior of the package 20, the pressure exerted around the first exposed part 44, including the first exposed part 44, is transmitted via the first extension 101 to the first terminal part 42, and less pressure is exerted on the top face 20B. This makes it less likely that the top face 20B will bend toward the interior of the package 20, and further suppresses cracking of the top face 20B.

The fact that the first extension face 101S is exposed at the outer surface of the molded article 30 means that the first extension 101 is in contact with the inner face of the metal mold in the process of manufacturing the molded article 30. Therefore, the first connector 41 is supported by the first extension 101, so minute vibrations of the first connector 41 can be suppressed by the resin material that is injected. Therefore, the resin material can be evenly spread out around the first connector 41, and this improves the adhesion between the molded article 30 and the first lead 40.

The same action and effect as the first extension are had by the second extension 102.

Other Embodiments

The present invention was described by the above embodiments, but the text and drawings that make up part of this disclosure should not be construed as limiting this invention. Various alternative embodiments, working examples, and applied technology will be apparent to a person skilled in the art from this disclosure.

(A) In the above embodiments, the first exposed part 44 was surrounded by the molded article 30 at the top face 20B, but this is not the only option. In terms of the strength of the package 20, the first exposed part 44 may be exposed at the boundary between the top face 20B and the rear face 20D, or the first exposed part 44 may be exposed all the way to the boundary between the top face 20B and the first side face $20E_1$ or the second side face $20E_2$. The same applies to the second exposed part 54 and the third exposed part 164.

(B) In the above embodiments, there was only one first exposed part 44, but this is not the only option. There may be a plurality of first exposed parts 44. The same applies to the second exposed part 54 and the third exposed part 164.

(C) In the above embodiments, the base part 43 had the concavity 43S, but this is not the only option. The base part 43 need not have the concavity 43S. Here again, heat can be effectively dispersed from the first exposed face 43A and the second exposed face 43B. In this case, if the third solder fillets 303 are not provided, then the third land 203 need not be formed on the mounting board 200.

(D) In the above embodiments, the base part 43 was L-shaped, and extended from the bottom face 20A side of the first connector 41 to the rear face 20D side, but this is not the only option. The base part 43 may be disposed on the bottom face 20A side of the first connector 41, and not extend to the rear face 20D side of the first connector 41. Specifically, the base part 43 may be a flat member that is disposed parallel to the bottom face 20A side of the first connector 41.

(E) In the above embodiments, the base part 43 was exposed from the molded article 30 at the bottom face 20A and the rear face 20D of the package 20, but this is not the only option. The base part 43 may be exposed at just the bottom face 20A.

(F) In the above embodiments, the base part 43 was L-shaped, but this is not the only option. The base part 43 may have a flat shape, a rod shape, a cylindrical shape, or some other, more complicated shape.

(G) In the above embodiments, the first terminal part 42 and the base part 43 were each formed in a three-dimensional shape, but this is not the only option. The shapes of the first terminal part 42 and the base part 43 can be modified as needed.

(H) In the above embodiments, the first solder fillet 301 came into contact with the first end face 42A and the second end face 42B of the first terminal part 42 as shown in FIG. 7, but this is not the only option. The first solder fillet 301 may be held in the first terminal concavity 42S and may be in contact with just the first end face 42A or the second end face 42B, or may not be in contact with either one.

(I) In the above embodiments, the light emitting device 100 had the first extension 101 on the first lead 40, and had the second extension 102 on the second lead 50, but this is not the only option. It may instead have just the first extension 101 on the first lead, or may have just the second extension 102 on the second lead.

(J) In the above embodiments, if the first lead 40 had the first terminal part 42 and the first exposed part 44, the second lead 50 had the second terminal part 52 and the second exposed part 54, and the first terminal part 42 and the second terminal part 52 are not in symmetry around the center point of the top face 20B, then the user can tell whether the first terminal part 42 is the cathode or the anode.

(K) In the above embodiments, the first exposed part 44 can be thinly plated. The same applies to the second exposed part 54 and the third exposed part 164.

Similarly, the second solder fillet 302 was in contact with the first end face 52A and the second end face 52B of the second terminal part 52, but this is not the only option. The second solder fillet 302 may be held in the second terminal concavity 52S and may be in contact with just the first end face 52A or the second end face 52B, or may not be in contact with either one.

Thus, the present invention of course encompasses various embodiments, etc., that are not discussed herein. Therefore the technological scope of the present invention is defined only by the invention-defining matters pertaining to the appropriate claims from the above description.

What is claimed is:

1. A method for manufacturing a circuit board constituted by a light emitting device and a mounting board, the light emitting device comprising a light emitting element and a package, the package constituted by a molded article and at least a first lead and a second lead embedded in the molded article, the package having a bottom face, a top face disposed opposite to the bottom face and a light emission face connected to the bottom face and the top face, the first lead and the second lead electrically connected with the light emitting element, the first lead including a first terminal part exposed at the bottom face and an exposed part exposed at the top face, the exposed part provided more toward the center of the package than the first terminal part, and a bottom face of the first terminal part being continuously flush with the bottom face of the package, the mounting board comprising a wiring component connected to the first terminal part, said method comprising the steps of:
    conveying the light emitting device onto the mounting board in a state in which the top face is chucked by a nozzle so that the nozzle and the exposed part are in contact; and
    placing the light emitting device onto the mounting board so that the first terminal part and the wiring component are in contact in a state in which the top face is chucked by the nozzle.

2. The method for manufacturing the circuit board according to claim 1, wherein
    the second lead has a second terminal part that is exposed at the bottom face.

3. The method for manufacturing the circuit board according to claim 1, wherein
    the first lead has a base part that is exposed at the bottom face, and
    the base part is distantly-positioned from the first terminal part on the bottom face.

4. The method for manufacturing the circuit board according to claim 3, wherein
    the exposed part is formed so as to be opposite the base part.

5. The method for manufacturing the circuit board according to claim 1, wherein
    the package has a first side face and second side face that are connected to the bottom face, the top face and the light emission face,
    the first terminal is successively-exposed at the bottom face and the first side face, and
    the second terminal is successively-exposed at the bottom face and the second side face.

6. The method for manufacturing the circuit board according to claim 1, wherein
    a side face of the exposed part is covered by the molded article.

7. The method for manufacturing the circuit board according to claim 1, wherein
    the first terminal part has a first terminal concavity opening at the bottom face.

8. The method for manufacturing the circuit board according to claim 7, wherein
    the package has a rear face opposed to the front face, and the first terminal concavity opens at the rear face.

9. The method for manufacturing the circuit board according to claim 1, wherein
    the first lead and the molded article are flush at the bottom face.

10. The method for manufacturing the circuit board according to claim 1, wherein
    the package has a first side surface that is contiguous with the bottom face, the top face, and the light emission face, and the first lead and the molded article are flush at the first side face.

11. A method for manufacturing a circuit board constituted by a light emitting device and a mounting board, the light emitting device comprising a light emitting element and a package, the package constituted by a molded article and a first lead, a second lead and a third lead embedded in the molded article, the package having a bottom face, a top face disposed opposite to the bottom face and a light emission face connected to the bottom face and the top face, the first lead including a first terminal part exposed at the bottom face, the second lead including a second terminal part exposed at the bottom face, the third lead including an exposed part exposed at the top face, the light emitting element being disposed on the third lead, the exposed part being provided more toward the center of the package than the first terminal part, and the third lead having a base part that is exposed at the bottom face, the mounting board comprising a wiring component connected to the first terminal part, said method comprising the steps of:
    conveying the light emitting device onto the mounting board in a state in which the top face is chucked by the nozzle so that the nozzle and the exposed part are in contact; and
    placing the light emitting device onto the mounting board so that the first terminal part and the wiring component are in contact in a state in which the top face is chucked by the nozzle.

12. The method for manufacturing the circuit board according to claim 11, wherein
    the exposed part is formed so as to be opposite the base part.

13. The method for manufacturing the circuit board according to claim 11, wherein
    the package has a first side face and second side face that are connected to the bottom face, the top face and the light emission face,
    the first terminal is successively-exposed at the bottom face and the first side face, and
    the second terminal is successively-exposed at the bottom face and the second side face.

14. The method for manufacturing the circuit board according to claim 11, wherein
    a side face of the exposed part is covered by the molded article.

15. The method for manufacturing the circuit board according to claim 11, wherein
    the first terminal part has a first terminal concavity opening at the bottom face.

16. The method for manufacturing the circuit board according to claim 15, wherein
    the package has a rear face opposed to the front face, and the first terminal concavity opens at the rear face.

17. The method for manufacturing the circuit board according to claim 11, wherein
    the first lead and the molded article are flush at the bottom face.

18. The method for manufacturing the circuit board according to claim 11, wherein
the package has a first side surface that is contiguous with the bottom face, the top face, and the light emission face, and the first lead and the molded article are flush at the first side face.

\* \* \* \* \*